US011719785B2

(12) United States Patent
Kreiss

(10) Patent No.: US 11,719,785 B2
(45) Date of Patent: Aug. 8, 2023

(54) TRANSMITTING ULTRASONIC SIGNAL DATA

(71) Applicant: Elmos Semiconductor SE, Dortmund (DE)

(72) Inventor: Dennis Kreiss, Münster (DE)

(73) Assignee: ELMOS SEMICONDUCTOR SE, Dortmund (DE)

( * ) Notice: Subject to any disclaimer, the term of this patent is extended or adjusted under 35 U.S.C. 154(b) by 274 days.

(21) Appl. No.: 16/612,839

(22) PCT Filed: May 16, 2018

(86) PCT No.: PCT/EP2018/062808
§ 371 (c)(1),
(2) Date: Nov. 12, 2019

(87) PCT Pub. No.: WO2018/210966
PCT Pub. Date: Nov. 22, 2018

(65) Prior Publication Data
US 2020/0209346 A1 Jul. 2, 2020

(30) Foreign Application Priority Data

May 16, 2017 (EP) ..................................... 17171320
Mar. 16, 2018 (DE) ...................... 10 2018 106 241.9

(51) Int. Cl.
*G01S 7/52* (2006.01)
*G01S 7/00* (2006.01)
(Continued)

(52) U.S. Cl.
CPC .......... *G01S 7/003* (2013.01); *G01S 7/52001* (2013.01); *G01S 7/539* (2013.01); *G01S 13/862* (2013.01); *G01S 15/876* (2013.01); *G01S 15/931* (2013.01)

(58) Field of Classification Search
None
See application file for complete search history.

(56) References Cited

U.S. PATENT DOCUMENTS 4,470,048 A * 9/1984 Short, III ................ G01S 7/412
382/192
2004/0204812 A1 10/2004 Tran
(Continued)

FOREIGN PATENT DOCUMENTS

CN 103119462 A * 5/2013 ........... G01S 15/931
DE 4433957 A1 3/1996
(Continued)

OTHER PUBLICATIONS

"Wavelet"; Mar. 22, 2017, Wikipedia, retrieved from the internet: https://de.wikipedia.org/w/index.php?title=Wavelet&oldid=163843365 [retrieved on Sep. 27, 2018], XP002785208 (12 pages; with English translation).
(Continued)

*Primary Examiner* — Hovhannes Baghdasaryan
(74) *Attorney, Agent, or Firm* — Mindful IP PLLC; Michael J. McCandlish

(57) ABSTRACT

Disclosed is a method for transmitting data via a vehicle data bus from an ultrasonic system, which comprises at least one ultrasonic transmitter and an ultrasonic receiver, to a data processing device, wherein predetermined signal profile characteristics are extracted from the echo signal received by the at least one ultrasonic receiver of the ultrasonic system. Echo signal data, which represent signal profile characteristics extracted from the echo signal, is created. Said echo signal data is transmitted from the ultrasonic system via the vehicle data bus to the data processing device.

12 Claims, 5 Drawing Sheets

(51) Int. Cl.
    *G01S 7/539*     (2006.01)
    *G01S 13/86*     (2006.01)
    *G01S 15/87*     (2006.01)
    *G01S 15/931*     (2020.01)

(56) References Cited

U.S. PATENT DOCUMENTS

| | | |
|---|---|---|
| 2006/0250297 A1 | 11/2006 | Prakah-Asanta et al. |
| 2012/0120768 A1 | 5/2012 | Horsky et al. |

FOREIGN PATENT DOCUMENTS

| | | | |
|---|---|---|---|
| DE | 19707651 | A1 | 8/1998 |
| DE | 10106142 | A1 | 8/2002 |
| DE | 102005024716 | A1 | 12/2006 |
| DE | 102008042640 | A1 | 4/2010 |
| DE | 102009027842 | A1 | 1/2011 |
| DE | 102010041424 | A1 | 3/2012 |
| DE | 102010044993 | A1 | 3/2012 |
| DE | 102011085286 | A1 | 8/2012 |
| DE | 102012200017 | A1 | 7/2013 |
| DE | 102012207164 | A1 | 10/2013 |
| DE | 102012015967 | A1 | 5/2014 |
| DE | 102013015402 | A1 | 4/2015 |
| DE | 102013226376 | A1 | 6/2015 |
| DE | 102015104934 | A1 | 10/2016 |
| DE | 102015104940 | A1 | 10/2016 |
| DE | 102012015967 | B4 | 6/2017 |
| DE | 102017123049 | B3 | 2/2018 |
| DE | 102017123050 | B3 | 2/2018 |
| DE | 102017123051 | B3 | 2/2018 |
| DE | 102017123052 | B3 | 2/2018 |
| DE | 102017104147 | A1 | 8/2018 |
| EP | 2455779 | A1 | 5/2012 |
| JP | 2003194921 | A | 7/2003 |
| JP | 2003315444 | A * | 11/2003 |
| WO | 2012016834 | A1 | 2/2012 |
| WO | 2014108300 | A1 | 7/2014 |

OTHER PUBLICATIONS

International Search Report and Written Opinion for PCT/EP2018/062808 dated Nov. 6, 2018 (48 pages; with English translation).
International Preliminary Report on Patentability for PCT/EP2018/062808 dated Aug. 29, 2019 (18 pages).

* cited by examiner

TRANSMITTING ULTRASONIC SIGNAL DATA

CROSS-REFERENCE TO RELATED APPLICATIONS

This application is a national stage of, and claims priority to, Patent Cooperation Treaty Application No. PCT/EP2018/062808, filed on May 16, 2018, which application claims priority to European Application No. EP17171320.9, filed on May 16, 2017 and German Application No. DE 10 2018 106 241.9, filed on Mar. 16, 2018, which applications are hereby incorporated herein by reference in their entireties.

TECHNICAL FIELD

The disclosure relates to a method for transmitting data via a vehicle data bus (uni- or bidirectional single-, dual- or multiwire data bus, possibly differential) from an ultrasonic system having at least one ultrasonic transmitter and one ultrasonic receiver to a data processing device. The disclosure relates in particular to a method for classifying an echo signal of an ultrasonic system in a vehicle for the purpose of data compression and transmission of the compressed data from the ultrasonic system to a data processing device.

BACKGROUND

For some time already, ultrasonic systems are used in vehicles for environment recognition. Here, ultrasonic burst signals are emitted by at least one ultrasonic transmitter which are received by at least one ultrasonic receiver of the ultrasonic system after having been reflected from an obstacle (generally speaking: an object). Mostly, a so-called ultrasonic transducer is implemented as the ultrasonic transmitter/ultrasonic receiver, which transducer operates as a transmitter in a first phase and operates as an ultrasonic receiver in a later phase of an interrogation distance.

The demands made on the recognition of obstacles or objects in the environment of a vehicle by means of ultrasonic systems have increased constantly in recent years. In the past, it may have been sufficient to know that an obstacle existed at a certain distance from the vehicle, whereas the aim today is to reconstruct what type of obstacle is present in the environment of the vehicle, using the echo signal profile.

However, the quantity of data to be transmitted between an ultrasonic system and a data processing device of the vehicle is increased thereby. The data busses typically used in vehicles, however, only have a limited maximum data transmission rate, not least for financial reasons.

Therefore, measures were taken already in the past to reduce the quantity of data to be transmitted. This is realized sometimes using obstacle object recognition (with corresponding confidence information for the reliability of the obstacle recognition) as described e.g. in DE 10 2008 042 640. Other examples of the implementation of ultrasonic systems with the possibility of reducing data transmission are found in DE 10 2005 024 716 A1 and DE 10 2012 207 164 A1.

It is desired to transmit ever more data of the actual measuring signal of the ultrasonic sensor to a central computer system where they are processed into so-called surroundings or environment maps together with data from other ultrasonic sensor systems and/or also from other types of sensor systems, e.g. radar systems, i.e. by sensor fusion. Therefore, it is desired to perform object recognition not in the ultrasonic sensor system itself, but only in the computer system using this sensor fusion, so as to avoid data losses and to thus reduce the probability of erroneous information and resultant erroneous decisions and thus the risk of accidents. At the same time, however, the transmission bandwidth of the available sensor data busses is limited. A replacement of the same should be avoided, since they have proven their worth in the field. Therefore, it is desired at the same time to avoid an increase in the quantity of data to be transmitted. Concisely speaking: the information content of the data and their relevance for the later obstacle recognition (i.e. object recognition) performed in the computer system has to be increased without having to augment the data rate excessively or, preferably, without having to augment the data rate at all. Quite the contrary, the data rate requirement should preferably be even lowered to allow for data rate capacities for the transmission of status data and self-testing information of the ultrasonic sensor system to the computer system, which is mandatory within the framework of functional safety. The present disclosure addresses this problem.

Various methods of processing an ultrasonic sensor signal are already known in prior art.

A method for evaluating an echo signal for vehicle environment detection is known e.g. from WO-A-2012/016 834. This document proposes to emit a measuring signal with a predeterminable encoding and form and to search the reception signal for components of the measuring signal in the reception signal by means of a correlation with the measuring signal and to determine these components. The level of correlation (not the level of the envelope of the echo signal) is then evaluated using a threshold value.

It is known from DE-A-4 433 957 to periodically emit ultrasonic pulses for object recognition and to conclude on the position of obstacles based on the propagation time thereof, wherein, upon evaluation, echoes that chronologically remain correlated for a plurality of measuring cycles are amplified, while echoes that remain uncorrelated are suppressed.

From DE-A-10 2012 015 967 a method for decoding a reception signal received by an ultrasonic sensor of a vehicle is known, in which a transmission signal of the ultrasonic sensor is emitted encoded and the reception signal is correlated with a reference signal for decoding, wherein prior to the correlation of the reception signal with the reference signal, a frequency shift of the reception signal relative to the transmission signal is determined and the reception signal is correlated with the transmission signal as the reference signal shifted in frequency by the frequency shift determined, wherein for the determination of the frequency shift of the reception signal, the same is subjected to a Fourier transformation and the frequency shift is determined based on a result of the Fourier transformation.

A method for the detection of the environment of a vehicle by means of ultrasound is known from DE-A-10 2011 085 286, in which ultrasonic pulses are emitted and the ultrasonic echoes reflected from objects are detected and the detection range is divided into at least two distance ranges, and wherein the ultrasonic pulses used for detection in a respective distance range are emitted independent from each other and are encoded by different frequencies.

A device and a method for environment detection by means of a signal converter and an evaluation unit are known from WO-A-2014/108300, wherein signals received from the environment having a first pulse response length are filtered in dependence on propagation time at a first time during a measurement cycle and signals received from the environment having a second, longer pulse response length are filtered in dependence on propagation time at a second, later time within the same measurement cycle.

However, the technical teachings of the above patents are all guided by the idea to perform the recognition of an obstacle (object) detected by means of the ultrasonic sensor already in the ultrasonic sensor itself and to transmit the object data only after the recognition of the object. However, in this manner synergy effects are lost when a plurality of ultrasonic sensors are used.

Various methods for a (partial pre-) processing of signals from ultrasonic sensors with a subsequent transmission of these signals are known from DE-A-197 07 651, DE-A-10 2010 044 993, DE-A-10 2012 200 017, DE-A-10 2013 015 402 and EP-A-2 455 779.

DESCRIPTION

It is an object of the disclosure to further increase the degree of data compression in an ultrasonic sensor of a vehicle, without thereby compromising the reliability of the recognition of obstacles and of the type of obstacles. It is a further object to further decrease the need for bus bandwidth for the transmission of measuring data from an ultrasonic sensor system to a computer system or to increase the efficiency of the data transmission.

To achieve the object the disclosure provides a method for transmitting data via a vehicle data bus from an ultrasonic system having at least one ultrasonic transmitter and one ultrasonic receiver to a data processing device, wherein, in the method, predetermined signal profile characteristics are extracted from an echo signal received by the at least one ultrasonic receiver of the ultrasonic system, a signal profile object is identified in the echo signal based on a group of extracted signal profile characteristics, each identified signal profile object is allocated to one of a plurality of predetermined signal profile object classes, each of which is specified by an identifier, for each identified signal profile object at least one object parameter describing the same is determined, wherein the object parameter(s) is (are) the time of occurrence of the signal profile object relative to a reference time, the temporal extent of the signal profile object, the amount of time between the signal profile object and another signal profile object preceding or trailing in the echo signal the peak and in particular the maximum peak of the signal profile object, the time of the peak and in particular the time of the maximum peak of the signal profile object within the temporal extent thereof and/or the size of the area of the echo signal section belonging to the signal profile object and in particular the size of the proportion of the area of the echo signal section belonging to the signal profile object above a threshold value or a threshold signal profile, and wherein the echo signal section belonging to the signal profile object can be reconstructed from the identifier of the signal profile object class and the object parameter (s) determined for a signal profile object, and for an identified signal profile object, the ultrasonic system transmits, via the vehicle data bus, the identifier and the object parameter(s) as echo signal section data representing the echo signal section of the signal profile object for the purpose of detecting an obstacle and/or a distance of an obstacle to at least one ultrasonic receiver or one of the ultrasonic receivers of the ultrasonic system.

The basic idea of the disclosure comprises the detection of potentially relevant structures in the measuring signal and the compression of this measuring signal by transmitting only a few data regarding these detected, potentially relevant structures instead of transmitting the measuring signal itself. The actual detection of objects, e.g. obstacles to a parking operation, occurs, possibly after reconstruction of the measuring signal as a reconstructed measuring signal, in the computer system where, typically, a plurality of compressed measuring signals of a plurality of ultrasonic sensor systems arrives (and is possibly decompressed). Thus, the disclosure in particular relates to the compression of data by the detection of structures in the measuring signal.

Thus, according to the proposal made by the present disclosure, the echo signals are examined for the presence of particular, predetermined signal profile characteristics so as to then transmit data representing these signal profile characteristics, wherein further conclusions may be drawn from these echo signal data in the data processing device of the vehicle. For example, the echo signal could be reconstructed or, in case of repeated detection of similar signal profile characteristics, which possibly occur offset in time, conclusions could be made on an obstacle, the type of obstacle or the change of distance of the vehicle from the obstacle etc. It is important in this respect that the task of detecting an obstacle is shifted from the ultrasonic system to the data processing device which reduces the demands made on the "intelligence" of the components of the ultrasonic system, which entails a possible reduction of the quantity of data to be transmitted from the ultrasonic system to the data processing device, since the actual analysis of the echo signal data as to what kind of obstacle is present in the environment of the vehicle and how this obstacle changes within the vehicle environment (in particular with respect to its distance from the vehicle) is performed in the data processing device.

According to the disclosure it is provided to examine a received echo signal for the presence of particular predefined signal profile characteristics. Single or a plurality of these signal profile characteristics define a special signal profile which will be referred to hereinafter as a signal profile object. Several object classes exist, the identified signal profile object being allocated to one of these object classes. Each object class is provided with an identifier. Further, according to the disclosure, at least one object parameter is determined that further describes or characterizes the identified signal profile object. Possible object parameters include e.g.:

the time of occurrence of the signal profile object relative to a reference time, the temporal extent of the signal profile object, the amount of time between the signal profile object and another signal profile object preceding or trailing in the echo signal and/or, the peak and in particular the maximum peak of the signal profile object, the time of the peak and in particular the time of the maximum peak of the signal profile object within the temporal extent thereof and/or the size of the area (integral) of the echo signal section belonging to the signal profile object and in particular the size of the proportion of the area of the echo signal section belonging to the signal profile object above a threshold value or a threshold signal profile.

From the identifier of the signal profile object and the object parameter(s) determined for a signal profile object the echo signal section belonging to the signal profile object can be reconstructed in the data processing device. In this manner, the echo signal section underlying an identified signal profile object, which as such would have to be transmitted to the data processing device via its (digital) sample values, can now be transmitted in a compressed state, i.e. with the use of significantly fewer data being transmitted to the data processing device. According to the disclosure so-called echo signal section data are transmitted which are at least the identifier of the signal profile object class and the at least one object parameter describing the signal profile object. If necessary, further data may be transmitted along, which will be addressed later.

In an example, it is provided that the ultrasonic system comprises a plurality of ultrasonic transmitters and a plurality of ultrasonic receivers, and that echo signal section data, which represent signal profile objects respectively identified from a plurality of echo signals received in a predeterminable time slot, are transmitted to the data processing device via the vehicle data bus for the purpose of detecting an obstacle and/or the distance of an obstacle to at least one ultrasonic receiver or one of the ultrasonic receivers of the ultrasonic system.

As already mentioned above, further data may be transmitted as echo signal section data, besides the identifier of the signal profile objects and the object parameter(s). It may be provided advantageously that, in addition to the echo signal section data, confidence values allocated to the respective identified signal profile objects are transmitted from the ultrasonic measuring device to the data processing device via the vehicle data bus.

The signal profile characteristics which, according to the disclosure, are to be searched for in the echo signal, suitably are a local extreme value of the echo signal with a time of occurrence, which value is above the threshold value or a threshold value signal; an absolute extreme value of the echo signal with a time of occurrence, which value is above the threshold value or a threshold value signal; a saddle point of the echo signal with a time of occurrence, which saddle point is above the threshold value or a threshold value signal; an exceeding of a or the threshold value or of a or the threshold value signal with a time of exceeding, which exceeding occurs as the signal level of the echo signal increases, and/or an undershooting of a or the threshold value or of a or the threshold value signal with a time of undershooting, which undershooting occurs as the signal level of the echo signal decreases; or predeterminable combinations of one or a plurality of the above mentioned signal profile characteristics which occur in chronological succession.

It may preferably be further provided that the signal profile characteristics or the object parameters further include whether and, if so, how the received echo signal is modulated, e.g. with a monotonously increasing or a strictly monotonously increasing frequency (chirp-up), e.g. with a monotonously decreasing or a strictly monotonously decreasing frequency (chirp-down) or e.g. with a constant frequency (no-chirp). In this context reference is made to DE-B-10 2017 123 049, DE-B-10 2017 123 051, DE-B-10 2017 123 052 and DE-B-10 2017 123 050 whose disclosures are incorporated into the subject matter of the present disclosure by reference.

Other frequency modulation methods or other modulation methods in general may also be implemented. For example, a modulation of the ultrasonic signals by an encoding of various kinds would be useful. Advantageously, doppler effect resistant encoding is used. Generally speaking, it is a characteristic of the encoding that it can be seen as a predetermined wavelet whose time mean value may in particular be different from zero.

In another example, it is provided that a plurality of ultrasonic transmitters of the ultrasonic system emit differently modulated ultrasonic signals, that the echo signal section data transmitted by the ultrasonic receivers also include an identifier of the modulation of the respective received echo signal, and that based on the identifier of the modulation, it can be determined in the data processing device from which ultrasonic transmitter the ultrasonic transmission signal has been emitted which has been received as an echo signal or an echo signal component by an ultrasonic receiver which transmits echo signal section data related to this echo signal or echo signal component to the data processing device.

The advantage of the method according to the disclosure takes effect in particular if the ultrasonic system has a plurality of ultrasonic transmitters and a plurality of ultrasonic receivers, wherein the echo signal data are transmitted to the data processing device via the vehicle data bus, which data represent the signal profile characteristics respectively extracted from a plurality of echo signals received in a predeterminable time slot. The data processing device now receives echo signals, or echo signal data of the signal profile characteristics detected in these echo signals which data describe these echo signals, received in a predeterminable time slot by a plurality of ultrasonic receivers. If, for example, ultrasonic receivers arranged adjacent to each other receive similar echo signals, this may be used to classify an obstacle. It has been found that it is significantly more efficient to determine the type of an obstacle based on a plurality of compressed echo signals from a plurality of ultrasonic receivers than to first examine each echo signal from each ultrasonic receiver individually so as to conclude on the type of an obstacle in order to eventually synchronize the obtained findings about the type of the obstacle with each other.

In the method of the present disclosure, a feature vector of the echo signal is generated, so to speak, which includes signal profile characteristics with associated times in the profile of the echo signal. The feature vector thus describes individual sections of the echo signal, as well as events in the echo signal, while no obstacle detection or the like is performed yet.

According to the disclosure it may also be provided to generate an envelope signal from the echo signal, which envelope signal is part of the feature vector or parts of which may be part of the feature vector. It is also possible to fold the echo signal with the associated ultrasonic transmission signal, i.e. to fold it with the ultrasonic signal received as the echo signal after reflection, and to thereby form a correlation signal whose characteristics can be part of the feature vector.

The echo signal data describing signal profile characteristics may advantageously comprise parameter data. A parameter data element may preferably be a time stamp indicating when the or a characteristic has occurred in the echo signal profile. The time-reference (i.e. the reference time) of the time stamp is optional but predefined for the system formed by the ultrasonic system and the data processing device. Another parameter may be the amplitude and/or the extension or the like of a section of the echo signal describing a signal profile characteristic. It should be mentioned at this point that in the following the term "amplitude" should be understood in a general manner and is used herein e.g. for the (present) signal level of a signal and/or for a peak value of the signal.

The compression of the data to be transmitted via the data bus between the ultrasonic system and the data processing device, which is achieved according to the disclosure, on the one hand lowers the data bus load and thus the criticality with respect to EMC requirements and on the other hand provides for free data bus capacities during the reception times of the echo signals, which free data bus capacities can then be used for the transmission of control commands from the data processing device and for the transmission of status information and other data of the ultrasonic system to the data processing device. An advantageously implemented prioritization of data to be transmitted guarantees that safety-relevant data are transmitted first and thus no unnecessary dead times for echo signal data are caused.

According to an example, it may be provided that the ultrasonic system comprises a plurality of ultrasonic transmitters and a plurality of ultrasonic receivers, and that the echo signal data representing the signal profile characteristics respectively extracted from a plurality of echo signals received in a predeterminable time slot are transmitted to the data processing device via the vehicle data bus.

According to an example, it may be provided that in addition to the echo signal data, confidence values allocated to the respective extracted signal profile characteristics are also transmitted from the ultrasonic measuring device to the data processing device via the vehicle data bus.

According to a further example, it may be provided that a signal profile characteristic is a local extreme value of the echo signal with a time of occurrence, which value is above the threshold value or a threshold value signal; an absolute extreme value of the echo signal with a time of occurrence, which value is above the threshold value or a threshold value signal; a saddle point of the echo signal with a time of occurrence, which saddle point is above the threshold value or a threshold value signal; an exceeding of a or the threshold value or of a or the threshold value signal with a time of exceeding, which exceeding occurs as the signal level of the echo signal increases, and/or an undershooting of a or the threshold value or of a or the threshold value signal with a time of undershooting, which undershooting occurs as the signal level of the echo signal decreases. However, a signal profile characteristic may also be a time sequence (with predeterminable order) of a plurality of the above signal profile characteristics.

Further, according to an example, it may be provided that the signal profile characteristics also include whether and, if so, how the received echo signal is modulated, e.g. with a monotonously increasing or a strictly monotonously increasing frequency (chirp-up), e.g. with a monotonously decreasing or a strictly monotonously decreasing frequency (chirp-down) or e.g. with a constant frequency (no-chirp).

According to a further example, it may be provided that a plurality of ultrasonic transmitters of the ultrasonic system emits differently modulated ultrasonic signals, and that it can be determined based on the modulation of the echo signals, which ultrasonic transmitter has emitted the ultrasonic transmission signal received as an echo signal or an echo signal component by an ultrasonic receiver. Thus, the disclosure proposes a method for transmitting sensor data from a sensor to a computer system. The method is particularly useful when implemented for the transmission of data of an ultrasonic reception signal from an ultrasonic receiver (hereinafter referred to as ultrasonic sensor) to a control device (as the computer system or data processing device) in a vehicle. According to an example, first an ultrasonic burst is generated and emitted into a free space, typically in the environment of the vehicle. Here, an ultrasonic burst is composed of a plurality of sonic pulses following each other at ultrasonic frequency. This ultrasonic burst is generated by a mechanical oscillator starting oscillation and allowing it to decay again. The ultrasonic burst thus emitted is then reflected at objects (e.g. obstacles) and is received by a receiver as an ultrasonic signal and converted into a reception signal. It is particularly preferred that the ultrasonic transmitter is identical with the ultrasonic receiver and will in this case be referred to as a transducer that operates alternately as an ultrasonic transmitter and as a ultrasonic receiver. However, the principle explained hereinafter is applicable to separate receivers and transmitters.

The ultrasonic sensor has a signal processing unit associated thereto which analyses the reception signal for predeterminable or predetermined signal profile characteristics, so as to minimize the necessary quantity of data to be transmitted for the description of the echo signal profile. The signal processing unit of the ultrasonic sensor performs, as it were, a data compression of the reception signal to generate compressed data, namely the characteristic echo signal data. The information are then transmitted to the computer system in a compressed state. Thereby, the EMC load caused by data transmission is minimized and status data of the ultrasonic sensor can be transmitted for system error detection in the temporal interstices to the computer system via the data bus between the ultrasonic sensor and the computer system.

It has proven advantageous to prioritize the transmission of the data via the data bus. Here, reports on safety-critical malfunctions of the sensor, i.e. the ultrasonic sensor as an example in the present instance, to the computer system have the highest priority, since these compromise the validity of the measuring data of the ultrasonic sensor with high probability. These data are supplied to the computer system by the ultrasonic system. The second highest priority lies with requests from the computer system to perform safety-relevant self-tests. Such commands are transmitted from the computer system to the ultrasonic system. The data of the ultrasonic sensor itself have the third highest priority, since the latency must not be extended. All other data have lower priorities with regard to transmission via the data bus.

It is particularly advantageous if the method for transmitting sensor data, in particular of an ultrasonic sensor, from a sensor to a computer system, in particular in a vehicle (comprising the emission of an ultrasonic burst with a start 57 and an end 56 of the emission of the ultrasonic burst, and comprising the reception of an ultrasonic signal and the forming of a reception signal for a reception time $T_E$ at least from the end 56 of the emission of the ultrasonic burst, as well as comprising the transmission of the compressed data via a data bus, in particular a single-wire data bus, to the computer system), is configured such that the transmission 54 of the data from the sensor to the computer system starts with a start command 53 from the computer system to the sensor via the data bus and prior to the end 56 of the emission of the ultrasonic burst, or starts after a start command 53 from the computer system to the sensor via the data bus and prior to the start 57 of the emission of the ultrasonic burst. After the start command 53, the transmission 54 is then performed in a periodically ongoing manner until the end of the data transmission 58. This end of the data transmission 58 comes chronologically after the end of the reception time $T_E$.

Another variant of the proposed method provides the forming of a feature vector signal from the reception signal as a first step of data compression. Such a feature vector signal may comprise a plurality of analog and digital data signals. Thus, it is a more or less complex data/signal structure. In the simplest case, it can be understood as a vectorial signal composed of a plurality of partial signals.

For example, it may be feasible to form a first and/or higher time derivative of the reception signal or a single or multiple integral of the reception signal, which are then partial signals in the feature vector signal.

It is also possible to form an envelope signal which is then a partial signal in the feature vector signal.

It may further be feasible to fold the reception signal with the emitted ultrasonic signal and to thus form a correlation signal which may then be a partial signal in the feature vector signal. Here, on the one hand, the signal may be used as an emitted ultrasonic signal that has been used to control the driver for the transmitter or, on the other hand, e.g. a signal may be used that was measured at the transmitter and thus corresponds better to the sound wave actually emitted.

Finally, it may be feasible to detect the occurrence of predetermined signal profile characteristics using matched filters and to form a matched-filter signal for the respective signal profile characteristics of some of the predetermined signal profile characteristics. A matched filter is a filter which optimizes the signal-to-noise ratio (SNR). Predefined signal profile characteristics are to be detected in the noisy signal. In the literature the terms "correlation filter", "signal-matched filter (SMF)" or simply "matched filter" are often found. The matched filter serves to optimally determine (detect) the presence of the amplitude and/or the position of a known signal waveform, the predetermined signal profile characteristics, even in the presence of interferences (parameter estimation) e.g. by signals from other ultrasonic transmitters and/or in case of ground clutter.

The matched-filter signals are then preferably partial signals in the feature vector signal.

Certain events can be indicated in separate partial signals of the feature vector signal. These events are also signal profile characteristics in the sense of this disclosure. Thus, signal profile characteristics not only comprise particular signal waveforms, such as e.g. rectangular pulses or wavelets or wave trains, but also distinctive points in the profile of the reception signal and/or in the profile of signals derived therefrom, such as e.g. an envelope signal which may be obtained from the reception signal e.g. by filtering.

Another signal that may be a partial signal of the feature vector signal may e.g. detect whether the envelope of the reception signal, i.e. the envelope signal, crosses a predetermined first threshold value.

Another signal that may be a partial signal of the feature vector signal may e.g. detect whether the envelope of the reception signal, i.e. the envelope signal, ascendingly crosses a predetermined second threshold value which may be identical with the first threshold value.

Another signal that may be a partial signal of the feature vector signal may e.g. detect whether the envelope of the reception signal, i.e. the envelope signal, descendingly crosses a predetermined third threshold value which may be identical with the first threshold value.

Another signal that may be a partial signal of the feature vector signal may e.g. detect whether the envelope of the reception signal, i.e. the envelope signal, has a maximum above a fourth threshold value which may be identical with the previous threshold values.

Another signal that may be a partial signal of the feature vector signal may e.g. detect whether the envelope of the reception signal, i.e. the envelope signal, has a minimum above a fifth threshold value which may be identical with the previous threshold values. Here, it is preferably evaluated whether the at least one preceding maximum of the envelope has a minimum distance to the minimum so as to avoid the detection of noise. Other filtrations are conceivable at this point. It may also be checked whether the time distance between this minimum and a preceding maximum is greater than a first minimum time distance. Meeting these conditions respectively sets a flag or a signal which itself preferably is a partial signal of the feature vector signal.

Likewise, it should be checked in an analogous manner whether the time- and amplitude-related distances of the other signal profile characteristics meet certain plausibility requirements such as minimum time distances and/or minimum amplitude distances. From these checks as well, it is possible to derive further, also analog, binary or digital partial signals which thus further increase the dimensionality of the feature vector signal.

If so desired, the feature vector signal can still be transformed into a significant feature vector signal in a significance augmentation stage. However, practice has shown that this is not yet necessary for present-day applications.

Additionally or alternatively, in an example method, the detection and the classification of signal profile characteristics into recognized signal profile characteristics classes in the reception signal are performed next based on the feature vector signal or the significant feature vector signal.

If, for example, the amplitude of the output signal of a matched filter, and thus of a partial signal of the feature vector signal, is above a possibly matched-filter specific sixth threshold value, the signal profile characteristic for which the matched filter is configured, may be considered as recognized. Here, other parameters are preferably considered as well. If, for example, an ultrasonic burst with an ascending frequency was transmitted during the burst (referred to as chirp-up), an echo is expected which has this modulation feature. If the signal waveform of the envelope, e.g. a triangular signal waveform of the envelope, coincides locally with an expected signal waveform in terms of time, but the modulation feature does not, this is not an echo from the transmitter but a noise signal which may come from other ultrasonic transmitters or from overreach. In that respect the system can differentiate between intrinsic echoes and extraneous echoes, whereby on and the same signal waveform is associated to two different signal profile characteristics, namely intrinsic echoes and extraneous echoes. Here, the transmission of intrinsic echoes is preferably prioritized over the transmission of extraneous echoes, since the former are generally relevant to safety and the latter are generally not relevant to safety.

Typically, at least one signal profile characteristic parameter is allocated to each recognized signal profile characteristic or determined for this signal profile characteristic. Preferably, this is a time stamp indicating when the characteristic occurred in the echo signal. The time stamp may refer e.g. to the temporal beginning of the signal profile characteristic in the reception signal or to the temporal end or the temporal position of the temporal focus of the signal profile characteristic etc. Other signal profile characteristic parameters such as amplitude, extension etc. are conceivable as well. In a variant of the proposed method, at least one of the allocated signal profile characteristic parameters is transmitted with the at least one recognized class of signal profile characteristics, which is a time value and indicates a temporal position that is suited to conclude therefrom on the time since the emission of a preceding ultrasonic burst. Preferably, this is used later to determine the distance of an object (e.g. obstacle) in the environment of the vehicle in dependence on a time value thus determined and transmitted.

Finally, the prioritized transmission of the recognized signal profile characteristic classes is performed, preferably each together with the allocated signal profile characteristic parameters. The transmission may also be performed in more complex data structures. For example, it is conceivable to first transmit the times of the recognized safety-relevant signal profile characteristics (e.g. identified obstacles) and to then transmit the recognized signal profile characteristic classes of the safety-relevant signal objects. The latency is reduced further in this manner.

In an example method According to the disclosure, a chirp value is determined as the allocated signal profile characteristic parameter which indicates whether the recognized signal profile characteristic is an echo of an ultrasonic transmission burst with chirp-up features or chirp-down features or no-chirp features. "Chirp-up" means that the frequency ascends within a received signal profile characteristic in the reception signal. "Chirp-down" means that the frequency descends within the received signal profile characteristic in the reception signal. "No-chirp" means that the frequency remains substantially the same within the received signal profile characteristic in the reception signal.

In an example method according to the disclosure it is possible to generate a confidence signal (confidence value) by e.g. forming the correlation between the reception signal or a signal derived therefrom, on the one hand, and a reference signal, e.g. the ultrasonic transmission signal or another expected wavelet. The confidence signal is then typically a partial signal of the feature vector signal.

In another variant of the method a phase signal is also formed on this basis, which signal indicates the phase shift of e.g. the reception signal or of a signal formed therefrom (e.g. the confidence signal) with respect to a reference signal, e.g. the ultrasonic transmission signal and/or another reference signal.

In a similar manner it is possible according to a further variant of the proposed method to form a phase confidence signal by forming the correlation between the phase signal or a signal derived therefrom, on the one hand, and a reference signal, and to use the same as a partial signal of the feature vector signal.

Upon evaluation of the feature vector signal, it is then feasible to perform a comparison of the phase confidence signal to one or a plurality of threshold values to generate a discretized phase confidence signal which itself again can become a part of the feature vector signal.

In a variant of the proposed method the evaluation of the feature vector signal and/or of the significant feature vector signal can be performed by forming one or a plurality of distance values between the feature vector signal and one or a plurality of signal profile characteristic prototype values for detectable signal profile characteristic classes. Such an distance value may be a Boolean, binary, discrete, digital or analog value. Preferably, all distance values are linked with each other in a non-linear function. Thus, if a chirp-up echo in triangular form is expected, a received chirp-down echo in triangular form can be rejected. This rejection is a non-linear process.

Conversely, the triangle may be defined differently in the reception signal. This foremost regards the amplitude of the triangle in the reception signal. If the amplitude in the reception signal is sufficient, the matched filter associated to this triangular signal e.g. supplies a signal above a predetermined seventh threshold value. In this case this signal profile characteristic class (triangular signal) can be allocated to this time of exceeding as a recognized signal profile characteristic. In this case the distance value between the feature vector signal and the prototype (here, the seventh threshold value) undershoots one or a plurality of predetermined binary, digital or analog distance values (here, 0=crossing).

In another variant of the method at least one signal profile characteristic class relates to wavelets which are estimated by estimation devices (e.g. matched filters) and/or estimation methods (e.g. estimation programs executed in a digital signal processor) and are thereby detected. The term wavelet refers to functions that can be used as the basis of a continuous or discrete wavelet transformation. The word is a new creation formed form the French "ondelette" meaning "small wave" and transferred into the English language partly literally ("onde"→"wave"), partly phonetically ("-lette"→"let"). The term "wavelet" was coined in the 1980s in geophysics (Jean Morlet, Alex Grossmann) for functions that generalize the short-time Fourier transformation, but has been used in the presently common sense since the late 1980s. In the 1990s a veritable wavelet boom was created, triggered by the discovery of compact, steady (up an optional order of differentiability) and orthogonal wavelets by Ingrid Daubechies (1988) and the development of the algorithm for fast wavelet transformation (FWT) using the multi-scale analysis (Multiresolution Analysis—MRA) by Stéphane Mallat and Yves Meyer (1989).

Contrary to the sine and cosine functions of the Fourier transformation, the most frequently used wavelets not only have locality in the frequency spectrum, but also in the time domain. Here, "locality" is to be understood in the sense of little variance. The probability density is the normalized square of the absolute value of the function of interest or of its Fourier transform. Here, the product of both variances is always greater that a constant, analogous to the Heisenberg uncertainty principle. Due to this limitation, the Paley-Wiener theory (Raymond Paly, Norbert Wiener) was developed in the field of function calculus, which is a precursor of the discrete wavelet transformation, and the Calderòn-Zygmund theory (Alberto Calderòn, Antoni Zygmund) which corresponds to the continuous wavelet transformation.

The integral of a wavelet function is always 0, which is why the wavelet function generally takes the form of waves ("small waves"=ondelettes=wavelets) petering out (becoming smaller) towards the outer side. In the sense of this disclosure, however, wavelets shall also be admissible that have an integral different from 0. The rectangular and triangular wavelets described hereinafter may be mentioned as examples in this context.

Important examples for wavelets with a 0 integral are the Haar wavelet (Alfred Haar 1909), the Daubechies wavelets named after Ingrid Daubechies (around 1990), the Coiflet wavelets also constructed by her, and the more theoretically important Meyer wavelet (Yves Meyer, around 1988).

Wavelets exist for space of any dimension, with a tensor product of a one-dimensional wavelet base being used most often. Because of the fractal nature of the two-scale equation in the MRA, most wavelets have a complicated shape, with most wavelets not having a closed form. This is of particular importance, because the above-mentioned Feature vector signal is multi-dimensional and thus allows for the use of multi-dimensional wavelets for signal object detection.

A particular variant of the method proposed therefore is the use of multi-dimensional wavelets with more than two dimensions for signal object detection. In particular, it is proposed to use corresponding matched filters for the detection of such wavelets with more than two dimensions, so as to possibly complement the feature vector signal with further partial signals are suited for detection.

A particularly useful wavelet, in particular for the analysis of the envelope signal, is a triangular wavelet, for example. The same is characterized by a start time of the triangular wavelet, a temporally linear increase of the wavelet amplitude up to a maximum of the amplitude of the triangular wavelet, the increase occurring temporally after the start time of the triangular wavelet, and a temporally linear decrease of the wavelet amplitude to an end of the triangular wavelet, the decrease occurring temporally after the maximum of the triangular wavelet.

Another particularly suited wavelet is a rectangular wavelet which in the sense of this disclosure also encompasses trapezoidal wavelets. A rectangular wavelet is characterized by a start time of the rectangular wavelet followed by an increase of the wavelet amplitude of the rectangular wavelet with a first temporal slope of the rectangular wavelet up to a first plateau time of the rectangular wavelet. The first plateau time of the rectangular wavelet is followed by the wavelet amplitude dwelling at a second slope of the wavelet amplitude up to a second plateau time of the rectangular wavelet. The second plateau time of the rectangular wavelet is followed by a decrease with a third temporal slope to the temporal end of the rectangular wavelet. Here, the gradient of the second temporal slope is less than 10% of the gradient of the first temporal slope and less than 10% of the gradient off the third temporal slope.

Instead of the above described wavelets other two-dimensional wavelets may also be used, such as e.g. a half sine wave wavelet which also has an integral different from 0.

It is proposed that in case of the use of wavelets, the temporal shift of the respective wavelet of the recognized signal profile characteristic is determined as a signal profile characteristic parameter, e.g. by correlation and/or the time of exceeding the level of the output of a matched filter suited for detecting the respective wavelet, via a predefined threshold value for this signal profile characteristic or this wavelet, respectively. Preferably, the envelope of the reception signal and/or a phase signal and/or a confidence signal etc. are evaluated.

Another possible signal profile characteristic parameter that can be determined is a temporal compression or extension of the respective wavelet of the recognized signal profile characteristic. Likewise, an amplitude of the wavelet of the recognized signal profile characteristic can be determined.

During the elaboration of the proposal for the disclosed method it was found that it is advantageous that the data of the recognized signal profile characteristics of the echoes arriving very fast are transmitted from the sensor to the computer system first and that the subsequent data of the signal profile characteristics recognized later are transmitted thereafter. Preferably at least the recognized signal profile characteristic class and a time stamp are transmitted every time, which time stamp should preferably indicate when the signal profile characteristic has arrived at the sensor. In the framework of the detection process scores may be allocated to the different signal profile characteristics which may be considered a section of the reception signal, which scores indicate the probability attributed to the presence of this signal profile characteristic according to the estimation algorithm used. In the simplest case such a score is binary. Preferably, however, it is a complex, real or integer number. Should a plurality of signal profile characteristics have a high score value, it is sometimes feasible to also transmit the data of recognized signal profile characteristics with lower scores. In order to enable a correct handling by the computer system, not only the date of the recognized signal profile characteristic and the time stamp for the respective signal profile characteristic should be transmitted in this case, but also the score value determined. Thus, a list of hypotheses comprising recognized signal profile characteristics and, in addition, allocated score values is transmitted to the computer system in this case.

Preferably the data of the recognized signal profile characteristic class and of the allocated data, e.g. the time stamp and score of the respective recognized signal profile characteristic classes, i.e. the signal profile characteristic parameters, are transmitted according to the FIFO principle. This ensures that the data of the reflections of the nearest objects are always transmitted first and that in this manner the safety-critical case of a collision of the vehicle with an obstacle is processed prioritized according to probability.

Besides a transmission of measuring data, a transmission of error conditions of the sensor may also be performed. This may also be effected during a reception time $T_E$, if the sensor determines via self-test devices that a defect exists and the data previously transmitted are potentially faulty. Thus, it is ensured that the computer system can obtain information about a change in the evaluation of the measuring data at the earliest time possible and can reject them or treat them in some other way. This is of particular importance for emergency brake systems, since an emergency braking is a safety-critical operation that must only be initiated if the underlying data have a corresponding confidence value. Compared to that, the transmission of the measuring data, e.g. the date of the recognized signal profile characteristic class, and/or the transmission of the single allocated signal profile characteristic parameter are therefore postponed and thus given lower priority. Of course, an interruption of the transmission upon the occurrence of an error in the sensor is conceivable. However, it may happen in some cases that an error seems possible but its presence is not ascertained. As such, a continuation of transmission is advisable in such cases. The transmission of safety-critical errors of the sensor is thus performed with higher priority.

Besides the two wavelets described before which have an integral value of 0 and the signal sections with an integral value different from 0, additionally denoted as wavelets herein, particular times in the profile of the reception signal may be conceived as signal profile characteristics in the sense of this disclosure which could be used for data compression and may be transmitted instead of sample values of the reception signal. This subset of the set of possible signal profile characteristics will be referred to hereinafter as signal profile points. Thus, the signal profile points are a special form of signal profile characteristics.

A first possible signal profile point, and thus a signal profile characteristic, is a crossing of the amplitude of a threshold value signal SW by the amplitude of the envelope signal 1 in an ascending direction.

A second possible signal profile point, and thus a signal profile characteristic, is a crossing of the amplitude of a threshold value signal SW by the amplitude of the envelope signal 1 in a descending direction.

A third possible signal profile point, and thus a signal profile characteristic, is a maximum of the amplitude of the envelope signal 1 above the amplitude of a threshold value signal SW.

A fourth possible signal profile point, and thus a signal profile characteristic, is a minimum of the amplitude of the envelope signal 1 above the amplitude of a threshold value signal SW.

For these four exemplary types of signal profile points and other types of signal profile points, it may possibly be feasible to use threshold value signals specific to the type of signal profile point.

The chronological sequence of signal profile characteristics is typically not optional. If, for example, a triangular wavelet is expected in the envelope signal 1 having a sufficient amplitude, what can be expected, in addition to a corresponding minimum level at the output of a matched filter suited for the detection of such a triangular wavelet, in temporal correlation with the exceeding of said minimum level at the output of said matched filter is 1. the occurrence of a first possible signal profile point with a crossing of the amplitude of a threshold value signal SW by the amplitude of the envelope signal 1 in an ascending direction, and subsequent thereto
2. the occurrence of a third possible signal profile point with a maximum of the amplitude of the envelope signal 1 above the amplitude of a threshold value signal SW, and subsequent thereto
3. the occurrence of a second possible signal profile point with a crossing of the amplitude of a threshold value signal SW by the amplitude of the envelope signal 1 in a descending direction.

Besides, this exceeding of said minimum level at the output of said matched filter is another example for a fifth possible signal profile point and thus a further possible signal profile characteristic.

The resulting grouping and chronological sequence of recognized signal profile characteristics can itself be recognized, e.g. by a Viterbi decoder, as a predefined expected grouping or chronological sequence of signal profile characteristics and can thus itself be a signal profile characteristic. As such, such a predefined grouping and/or chronological sequence of other signal profile characteristics is a sixth possible signal profile point and thus a signal profile characteristic.

When such a grouping of signal profile characteristics or a chronological sequence of signal profile characteristic classes is recognized, the transmission of this recognized summarizing signal profile characteristic class and of at least the one allocated signal profile characteristic parameter is performed subsequently, preferably instead of a transmission of the individual signal profile characteristics, since significant data bus capacities are saved in this manner. There may be cases in which both are transmitted. Here, the date of the signal profile characteristic class of a signal profile characteristic is transmitted, which is a predefined chronological sequence and/or grouping of other signal profile characteristics. To achieve compression, it is advantageous if at least one signal profile characteristic class of at least one of the other signal profile characteristics is not transmitted.

A chronological grouping of signal profile characteristics is given in particular if the temporal distance of these signal profile characteristics does not exceed a predefined distance. In the above-mentioned example consideration should be given to the propagation time of the signal in the matched filter. Typically, the matched filter should be slower than the comparators. Therefore, the change in the output signal of the matched filter should have a fixed chronological correlation with the temporal occurrence of the relevant signal profile points.

It is particularly preferred to perform the data transmission in the vehicle via a bidirectional single-wire data bus. Here, the return path is preferably ensured by the vehicle body. Preferably the sensor data are transmitted to the computer system in a current-modulated state. The data for controlling the sensor are transmitted to the sensor by the computer system preferably in a voltage-modulated state. According to the disclosure it has been found that the use of a PSI5 data bus and/or of a DSI3 data bus is particularly suitable for data transmission. Moreover, it has been found that it is particularly advantageous to perform the transmission of the data to the computer system at a transmission rate of >200 kBit/s and to perform transmission of the data from the computer system to the at least one sensor at a transmission rate of >10 kBit/s, preferably >20 kBit/s. Further, it has been found that the transmission of data from the sensor to the computer system should be modulated on the data bus whose current is less than 50 mA, preferably less than 5 mA, more preferred less than 2.5 mA. These busses have to be adapted to these operating values in a corresponding manner. However, the basic principle remains the same.

For the execution of the above described methods a computer system with a data interface to the above-mentioned data bus, preferably said single-wire data bus, is required which supports the decompression of the data thus compressed. Generally, however, the computer system will not perform a full decompression but evaluate e.g. only the time stamp and the recognized signal profile characteristic type. The sensor required to execute one of the above described methods comprises at least one transmitter and at least one receiver for generating a reception signal, which may also be implemented in combination as one or a plurality of transducers. Further, it comprises at least devices for processing and compressing the reception signal, as well as a data interface for transmitting the data via the data bus, preferably said single-wire data bus, to the computer system. For compression, the compression device preferably comprises at least one of the following partial devices: matched filters, comparators, threshold value signal generating devices for generating one or a plurality of threshold value signals SW, differentiators for forming derivatives, integrators for forming integrated signals, other filters, envelope formers for generating an envelope signal from the reception signal, correlation filters for comparing the reception signal or signals derived therefrom with reference signals.

BRIEF DESCRIPTION OF THE DRAWINGS

The disclosure will be explained in more detail hereinafter with reference to examples and to the drawings. Specifically, the Figures show.

DETAILED DESCRIPTION

As explained above, the technical teachings of prior art are all guided by the idea to perform the recognition of an obstacle (object) detected by means of the ultrasonic sensor already in the ultrasonic sensor itself and to transmit the object data only after the recognition of the object. However, since synergy effects are lost when a plurality of ultrasonic sensors are used, it has been found that it is not feasible to transmit only the echo data of the ultrasonic sensor itself, but to transmit all data.

Furthermore, in a central computer system the data of preferably a plurality of sensors can advantageously be evaluated. For this purpose, however, the compression of the data for a transmission via a data bus with low bus bandwidth must be performed in a manner different from prior art. Thereby, the synergy effects may be made accessible. For example, it is conceivable that a vehicle comprises more than one ultrasonic sensor. For the differentiation of the two sensors it is feasible if these two sensors transmit with different encoding. Contrary to prior art, both sensors are now to detect the ultrasonic echoes of both emissions of the two ultrasonic sensors and transmit these in a suitably compressed manner to the central computer system, where the ultrasonic reception signals are reconstructed and combined. Recognition of the obstacles (objects in the environment) is performed only after reconstruction (decompression). In addition, this allows for a further combination of the ultrasonic sensor data with the data of other sensor systems such as e.g. radar etc.

Figure 1:
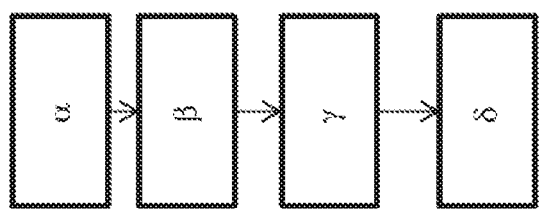
FIG. 1 the basic process of signal compression and transmission.

A method for transmitting sensor data from a sensor to a computer system is disclosed. The method is particularly suited for the transmission of data of an ultrasonic reception signal from an ultrasonic sensor to a control device such as the computer system in a vehicle. The method will be explained with reference to FIG. 1. According to the method proposed, first an ultrasonic burst is generated and emitted into a free space, typically in the environment of the vehicle (step α in FIG. 1). Here, an ultrasonic burst is composed of a plurality of sonic pulses following each other at ultrasonic frequency. This ultrasonic burst is generated by a mechanical oscillator slowly starting to oscillate and then lets the oscillation decay. The ultrasonic burst thus emitted by the exemplary ultrasonic transducer is then reflected by objects in the environment of the vehicle and received as an ultrasonic signal by a ultrasonic receiver or by the ultrasonic transducer itself and is converted into an electric reception signal (step β in FIG. 1). It is particularly preferred that the ultrasonic transmitter is identical with the ultrasonic receiver, which is referred to as a transducer in the following, the transducer being an electro-acoustic component which is alternatingly operated as a ultrasonic transmitter or a ultrasonic receiver and thus as a ultrasonic sensor. However, the principle explained below is also applicable to separate receivers and transmitters. The ultrasonic sensor proposed is provided with a signal processing unit which analyzes and compresses (step γ in FIG. 1) the electric reception signal (referred to hereinafter as "reception signal") that corresponds to the ultrasonic reception signal, so as to minimize the necessary data transmission (quantity of data to be transmitted) and to provide free space for e.g. status messages and further control commands from the control computer to the signal processing unit or the ultrasonic sensor system. Thereafter, the compressed electric reception signal is transmitted to the computer system (step δ in FIG. 1).

The associated method thus serves to transmit sensor data, in particular of an ultrasonic sensor, from a sensor to a computer system, in particular in a vehicle. The transmission is preceded by the emission of an ultrasonic burst (step α in FIG. 1) and the reception of an ultrasonic signal, as well as the forming of an electric reception signal (step β of FIG. 1). Subsequently, a data compression of the reception signal is performed (step γ in FIG. 1) for the generation of compressed data (step γ in FIG. 1) by detecting preferably at least two or three or more predetermined characteristics in the reception signal. It is preferred that by sampling (step γa in FIG. 2 in which step γa is divided into five sub-steps) the electric reception signal is converted into a sampled reception signal formed by a time-discrete stream of sample values. Typically, one sampling time can be allocated to each sample value as a time stamp of this sample value. The compression can be performed e.g. by a wavelet transformation (step γb in FIG. 2). For this purpose, the received ultrasonic signal in the form of the sampled reception signal can be compared to predetermined basic signal forms (referred to as signal profile characteristics further above) which are e.g stored in a library, by forming a correlation integral (also refer to Wikipedia for this term) between the predetermined basic signal forms and the sampled reception signal. The chronological sequence of basic signal forms in the reception signal respectively forms a signal object which is allocated to one of a plurality of signal object classes. By forming the correlation integral respective associated spectral values of this signal object class are determined for each of these signal object classes. Since this occurs continually, the spectral values themselves represent a stream of time-discrete momentaneous spectral values, wherein a time stamp can be allocated to each spectral value. An alternative, mathematically equivalent method is the use of matched filters per predetermined signal object class (basic signal form). Since generally a plurality of signal object classes is used, which may in addition be subjected to different time spreads (cf. "Wavelet analysis"), a time-discrete stream of multidimensional vectors of spectral values of different signal object classes and their respective different time spreads is obtained in this manner, wherein, again, a time stamp is allocated to each of these multidimensional vectors. Each of these multidimensional vectors is a so-called feature vector. Thus, the stream is a time-discrete stream of feature vectors. Again, a time stamp is allocated to each of these feature vectors (step γb in FIG. 2).

Thus, due to the continuous temporal shift, a temporal dimension is also obtained. As a result, the feature vector of the spectral values can be complemented by past values or values depending on these, e.g. temporal integrals or derivatives or filter values of one or a plurality of these values etc. This can further increase the dimensionality of these feature vectors within the feature vector data stream. To keep the subsequent effort low, a limitation to a few signal object classes during the extraction of the feature vectors from the sampled reception signal of the ultrasonic sensor is thus feasible. Accordingly, matched filters can be used, for example, to continuously monitor the occurrence of these signal object classes in the reception signal.

As examples for particularly simple signal object classes, an isosceles triangle and a double peak may be named in particular. A signal object class is generally formed by a predetermined spectral coefficient vector, i.e. a predetermined feature vector value.

Figure 2:
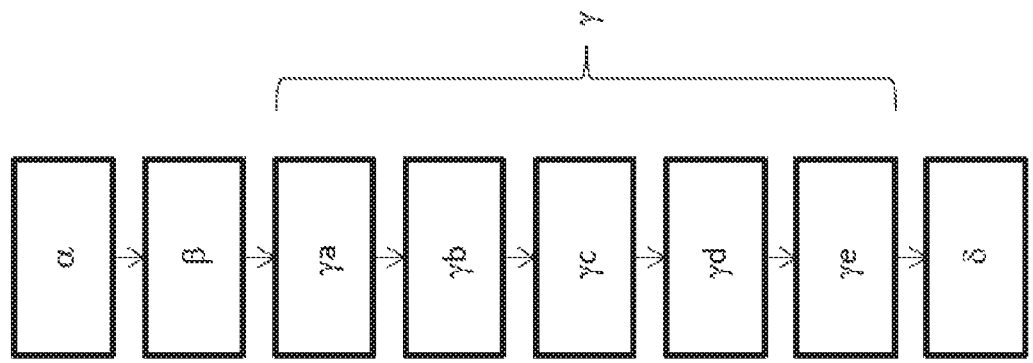
FIG. 2 the basic process of signal compression and transmission in greater detail, FIG. 3*a* a conventional ultrasonic echo signal and the conventional evaluation of the same, FIG. 3*b* a conventional ultrasonic echo signal and the conventional evaluation of the same, with the amplitude also being transmitted, FIG. 3*c* an ultrasonic echo signal, in which the chirp direction is included, FIG. 3*d* recognized signal objects (triangular signals) in the signal of FIG. 3*c* with rejection of signal portions not recognized, FIG. 4*a* a conventional transmission, FIG. 4b the transmission of analyzed data after complete reception of the ultrasonic echo, FIG. 4c the transmission of compressed data, wherein in this example symbols for basic signal objects substantially without compression are transmitted corresponding to prior art, FIG. 5 the transmission of compressed data, wherein in this example symbols for basic signal objects are compressed to form symbols for signal objects, FIG. 6 the transmission of compressed data, wherein in this example symbols for basic signal objects are compressed to form symbols for signal objects and not only the envelope signal, but also the confidence signal is evaluated.

For a determination of the relevance of the spectral coefficients of a feature vector of an ultrasonic echo signal, the determination of the value of the distance of these characteristics, the elements of the vector of the momentaneous spectral coefficients (feature vector), to at least a combination of these characteristics (prototype) in the form of a signal object class which is symbolized by a predetermined feature vector (prototype or prototype vector) from a library of predetermined signal object class vectors (step γd in FIG. 2). Preferably, prior to correlation, the spectral coefficients of the feature vector are normalized with the prototypes (step γc in FIG. 2). The distance determined by this distance determination may be formed e.g. by the sum of all differences between a spectral coefficient of the predetermined feature vector (prototype or prototype vector) of the respective prototype and the corresponding normalized spectral coefficient of the present feature vector of the ultrasonic echo signal, respectively. A Euclidian distance would be formed by the square root of the sum of the squares of all differences between a spectral coefficient of the predetermined feature vector (prototype or prototype vector) of the respective prototype and the corresponding normalized spectral coefficient of the present feature vector of the ultrasonic echo signal, respectively. However, this distance forming is generally too complex. Other methods of distance forming are conceivable. Each predetermined feature vector (prototype or prototype vector) may then have a symbol and possibly also a parameter, e.g. the distance value and/or the amplitude, allocated thereto prior to normalization. If the distance thus determined undershoots a first threshold value, and if it is the smallest distance of the present feature vector value to one of the predetermined feature vector values (prototypes or values of prototype vectors), its symbol is continued to be used as a recognized prototype. Thus, a pair composed of a recognized prototype and a time stamp of the present feature vector is formed. Then, preferably the transmission of data, in this case of the determined symbol that symbolizes the recognized prototype best, and e.g. of the distance, as well as the time of occurrence (time stamp), to the computer system is performed (step δ in FIG. 2) only if the value of this distance is below the first threshold value and the recognized prototype is a prototype to be transmitted. It is well possible that prototypes that are not to be recognized, are stored e.g. for noise, i.e. the absence of reflections etc. These data are irrelevant to the detection of obstacles and should therefore not be transmitted. Thus, a prototype is recognized when the value of the determined distance between the present feature vector value and the predetermined feature vector value (prototype or value of prototype vector) are below this first threshold value (step γe in FIG. 2).

Thus, it is preferably no longer the ultrasonic echo signal itself that is transmitted, but only a sequence of symbols for recognized typical temporal signal profiles in the echo signal and of time stamps belonging to these signal profiles in a particular time period (step δ in FIG. 2). Then, per recognized signal object, only one symbol for the recognized signal form prototype, the parameter (e.g. amplitude of the envelope and/or temporal extension) of the same and a time reference point of the occurrence of this signal form prototype (the time stamp) are preferably transmitted as the recognized signal object, respectively. The transmission of the individual sample values or of times at which threshold values are exceeded by the envelope of the sampled reception signal etc. is omitted. In this manner, this selection of the relevant prototypes leads to a massive data compression and to a reduction of the bus bandwidth required.

Thus, a quantitative detection of the presence of a combination of characteristics is performed while forming an estimate—in this instance e.g. the inverse distance between the representative of the signal object class in the form of the predetermined feature vector (prototype or prototype vector)—and the subsequent transmission of the compressed data to the computer system, if the value of this estimate (e.g. the inverse distance) is above a second threshold value or the inverse estimate is below a first threshold value. The signal processing unit of the ultrasonic sensor thus performs a data compression of the reception signal to generate compressed data. The ultrasonic sensor then transmits the thus compressed data, preferably only the encodings (symbols) of the thus recognized prototypes, their amplitude and/or temporal extension and the time of occurrence (time stamp) to the computer system. Thereby, the EMC load caused by the data transmission via the data bus between the ultrasonic sensor and the computer system is minimized and, during the time distances, other data, e.g. status data of the ultrasonic sensor, can be transmitted for system error detection to the computer system via the data bus between the ultrasonic sensor and the computer system, whereby latency is improved.

It has been found that data should be transmitted via the data bus in a prioritized fashion. Reports on safety-critical malfunctions of the sensor, i.e. the ultrasonic sensor as an example in the present instance, to the computer system have the highest priority, since these compromise the validity of the measuring data of the ultrasonic sensor with high probability. These data are supplied to the computer system by the ultrasonic system. The second highest priority lies with requests from the computer system to perform safety-relevant self-tests. Such commands are transmitted from the computer system to the ultrasonic system.

The data of the ultrasonic sensor itself have the third highest priority, since the latency must not be extended. All other data have (even) lower priorities with regard to transmission via the data bus.

It is particularly advantageous if the method for transmitting sensor data, in particular of an ultrasonic sensor, from a sensor to a computer system, in particular in a vehicle, comprises:
  the emission of an ultrasonic burst with a start (57) and an end (56) of the emission of the ultrasonic burst,
  the reception of an ultrasonic signal and the forming of a reception signal for a reception time ($T_E$) at least from the end (56) of the emission of the ultrasonic burst, and
  the transmission of the compressed data via a data bus, in particular a single-wire data bus, to the computer system such that the transmission (54) of the data from the sensor to the computer system starts with a start command (53) from the computer system to the sensor via the data bus, which is prior to the end (56) of the emission of the ultrasonic burst, or starts after a start command (53) from the computer system to the sensor via the data bus, which is prior to the start (57) of the emission of the ultrasonic burst, wherein after the start command (53), the transmission (54) is then performed in a periodically ongoing manner until the end of the data transmission (58) which comes chronologically after the end of the reception time ($T_E$).

Another variant of the proposed method thus provides, as a first step of data compression, the forming of a feature vector signal (stream of feature vectors with n feature vector values and n as the dimension of the feature vector) from the reception signal as a first step of data compression. Such a feature vector signal may comprise a plurality of analog and digital data signals. Thus, the feature vector signal is a more or less complex data/signal structure. In the simplest case, it can be understood as a vectorial signal composed of a plurality of partial signals.

For example, it may be feasible to form a first and/or higher time derivative of the reception signal or a single or multiple integral of the reception signal, which are partial signals in the feature vector signal.

It is also possible to form an envelope signal of the reception signal which is then a partial signal in the feature vector signal.

It may further be feasible to fold the reception signal with the emitted ultrasonic signal and to thus form a correlation signal which may then be a partial signal in the feature vector signal. Here, on the one hand, the signal may be used as an emitted ultrasonic signal that has been used to control the driver for the transmitter or, on the other hand, e.g. a signal may be used that was measured at the transmitter and thus corresponds better to the sound wave actually emitted.

Finally, it may be feasible to detect the occurrence of predetermined signal objects using matched filters and to form a matched-filter signal for the respective signal objects of some of the predetermined signal objects. A matched filter is a filter which optimized the signal-to-noise ratio (SNR). Predefined signal objects are to be detected in the noisy signal. In the literature the terms correlation filter, signal-matched filter (SMF) or simply matched filter are often found. The matched filter serves to optimally determine (detect) the presence of the amplitude and/or the position of a known signal waveform, the predetermined signal object, even in the presence of interferences (parameter estimation) e.g. by signals from other ultrasonic transmitters and/or in case of ground clutter.

The matched-filter signals are then preferably partial signals in the feature vector signal.

Certain events can be indicated in separate partial signals of the feature vector signal. These events are basic signal objects in the sense of this disclosure. Thus, basic signal objects do not comprise signal waveforms, such as e.g. rectangular pulses or other forms of wavelets or wave trains, but distinctive points in the profile of the reception signal and/or in the profile of signals derived therefrom, such as e.g. an derived envelope signal which may be obtained from the reception signal e.g. by filtering.

Another signal that may be a partial signal of the feature vector signal may e.g. detect whether the envelope of the reception signal, i.e. the envelope signal, crosses a predetermined third threshold value. This signal thus is a signal that indicates the presence of a basic signal object in the reception signal and thus the feature vector signal.

Another signal that may be a partial signal of the feature vector signal may e.g. detect whether the envelope of the reception signal, i.e. the envelope signal, ascendingly crosses a predetermined fourth threshold value which may be identical with the third threshold value. This signal thus is a signal that indicates the presence of a basic signal object in the reception signal and thus the feature vector signal.

Another signal that may be a partial signal of the feature vector signal may e.g. detect whether the envelope of the reception signal, i.e. the envelope signal, descendingly crosses a predetermined fifth threshold value which may be identical with the third or the fourth threshold value. This signal thus is a signal that indicates the presence of a basic signal object in the reception signal and thus the feature vector signal.

Another signal that may be a partial signal of the feature vector signal may e.g. detect whether the envelope of the reception signal, i.e. the envelope signal, has a maximum above a sixth threshold value which may be identical with the previously mentioned third to fifth threshold values. This signal thus is a signal that indicates the presence of a basic signal object in the reception signal and thus the feature vector signal.

Another signal that may be a partial signal of the feature vector signal may e.g. detect whether the envelope of the reception signal, i.e. the envelope signal, has a minimum above a seventh threshold value which may be identical with the previously mentioned third to sixth threshold values. This signal thus is a signal that indicates the presence of a basic signal object in the reception signal and thus the feature vector signal.

Here, it is preferably evaluated whether the at least one preceding maximum of the envelope has a minimum distance to the minimum so as to avoid the detection of noise. Other filtrations are conceivable at this point. It may also be checked whether the time distance between this minimum and a preceding maximum is greater than a first minimum time distance. Meeting these conditions respectively sets a flag or a signal which itself preferably is a partial signal of the feature vector signal.

Likewise, it should be checked in an analogous manner whether the time- and amplitude-related distances of the other signal objects meet certain plausibility requirements such as observing minimum time distances and/or minimum amplitude distances. From these checks as well, it is possible to derive further, also analog, binary or digital partial signals which thus further increase the dimensionality of the feature vector signal.

If so desired, the feature vector signal can still be transformed into a significant feature vector signal in a significance augmentation stage, e.g. by a linear map or a matrix polynomial of a higher order. However, practice has shown that this is not yet necessary at least for present-day applications.

In an example method, the detection and the classification of signal objects into recognized signal object classes in the reception signal are performed next based on the feature vector signal or the significant feature vector signal.

If, for example, the amplitude of the output signal of a matched filter, and thus of a partial signal of the feature vector signal, is above a possibly matched-filter specific (e.g. eighth) threshold value, the signal object for the detection of which the matched filter is configured, may be considered as recognized. Here, other parameters are preferably considered as well. If, for example, an ultrasonic burst with an ascending frequency was transmitted during the burst (referred to as chirp-up), an echo is expected which has this modulation feature. If the signal waveform of the envelope, e.g. a triangular signal waveform of the envelope, coincides locally with an expected signal waveform in terms of time, but not with the modulation feature, this is not an echo from the transmitter but a noise signal which may come from other ultrasonic transmitters or from overreach. In that respect the system can then differentiate between intrinsic echoes and extraneous echoes, whereby one and the same signal waveform is associated to two different signal objects, namely intrinsic echoes and extraneous echoes. Here, the transmission of intrinsic echoes from the sensor to the computer system via the data bus is preferably prioritized over the transmission of extraneous echoes, since the former are generally relevant to safety and the latter are generally not relevant to safety.

Typically, at least one signal object parameter is allocated to each recognized signal object or determined for this signal object. Preferably, this is a time stamp indicating when the object occurred in the echo signal. The time stamp may refer e.g. to the temporal beginning of the signal object in the reception signal or to the temporal end or the temporal duration of the signal object or the temporal position of the temporal focus of the signal object etc. Other signal object parameters such as amplitude, extension etc. are conceivable as well. In a variant of the proposed method, at least one of the allocated signal object parameters is transmitted with a symbol for the at least one signal object class to which the at least one recognized class of signal objects belongs. The signal object parameter preferably is a time value as a time stamp and indicates a temporal position that is suited to conclude therefrom on the time since the emission of a preceding ultrasonic burst. Preferably, this is used to later determine a distance of an object therefrom in dependence on a time value thus determined and transmitted.

Finally, the prioritized transmission of the recognized signal object classes in the form of allocated symbols with time stamps is performed, preferably each together with the allocated signal object parameters. The transmission may also be performed in more complex data structures (records). For example, it is conceivable to first transmit the times of the recognized safety-relevant signal objects (e.g. identified obstacles) and to then transmit the recognized signal object classes of the safety-relevant signal objects. The latency is reduced further in this manner.

The proposed method comprises, at least in a variant, the determination of a chirp value as the allocated signal object parameter which indicates whether the recognized signal object is an echo of an ultrasonic transmission burst with chirp-up features or chirp-down features or no-chirp features. "Chirp-up" means that the frequency ascends within a received signal object in the reception signal. "Chirp-down" means that the frequency descends within the received signal object in the reception signal. "No-chirp" means that the frequency remains substantially the same within the received signal object in the reception signal.

Additionally or alternatively, in an example method, a confidence signal (confidence value) can be generated by forming the correlation, e.g. by forming a time-continuous or time-discrete correlation signal between the reception signal or, instead of the reception signal, a signal derived from the reception signal, on the one hand, and a reference signal, e.g. the ultrasonic transmission signal or another expected wavelet, on the other hand. The confidence signal then typically is a partial signal of the feature vector signal, i.e. a component of the feature vector composed of a sequence of vectorial sample values (feature vector values).

Additionally or alternatively, in an example method, a phase signal can be formed on this basis, which signal indicates the phase shift of e.g. the reception signal or of a signal formed therefrom (e.g. the confidence signal) with respect to a reference signal, e.g. the ultrasonic transmission signal and/or another type of reference signal. The phase signal then typically also is a partial signal of the feature vector signal, i.e. a component of the feature vector composed of a sequence of vectorial sample values.

Additionally or alternatively, it is possible to form a phase confidence signal by forming the correlation between the phase signal or a signal derived therefrom, on the one hand, and a reference signal, and to use the same as a partial signal of the feature vector signal. The phase confidence signal then typically also is a partial signal of the feature vector signal, i.e. a component of the feature vector composed of a sequence of vectorial sample values.

Upon evaluation of the feature vector signal, it may now be feasible to perform a comparison of the phase confidence signal to one or a plurality of threshold values to generate a discretized phase confidence signal which itself again can become a part of the feature vector signal.

Additionally or alternatively, the evaluation of the feature vector signal and/or of the significant feature vector signal can be performed by forming one or a plurality of distance values between the feature vector signal and one or a plurality of signal object prototype values for recognizable signal object classes. Such a distance value may be a Boolean, binary, discrete, digital or analog value. Preferably, all distance values are linked with each other in a non-linear function. Thus, if a chirp-up echo in triangular form is expected, a received chirp-down echo in triangular form can be rejected. In the sense of the disclosure this rejection is a "non-linear" process.

Conversely, the triangle may be defined differently in the reception signal. This foremost regards the amplitude of the triangle in the reception signal. If the amplitude in the reception signal is sufficient, the matched filter associated to this triangular signal e.g. supplies a signal above a predetermined ninth threshold value. In this case a recognized signal object can be allocated to this signal object class (for triangular signals) at the time of exceeding. In this case the distance value between the feature vector signal and the prototype (here, the ninth threshold value) undershoots one or a plurality of predetermined binary, digital or analog distance values (here, 0=crossing).

It may be advantageous to first transmit the data of the recognized signal objects of the echoes arriving very fast from the sensor to the computer system and to transmit the subsequent data of the signal objects recognized later only thereafter. Preferably at least the recognized signal object class and a time stamp are transmitted every time, which time stamp should preferably indicate when the signal object has arrived at the sensor. In the framework of the detection process scores may be allocated to the different signal objects which may be considered a section of the reception signal, which scores indicate the probability attributed to the presence of this signal object according to the estimation algorithm used. In the simplest case such a score is binary. Preferably, however, it is a complex, real or integer number. It may be the determined distance, for example. Should a plurality of signal objects have a high score value, it is sometimes feasible to also transmit the data of recognized signal objects with lower scores. In order to enable a correct handling by the computer system, not only the date (symbol) of the recognized signal object and the time stamp for the respective signal object should be transmitted in this case, but also the score value determined. Instead of transmitting only the date (symbol) of the recognized signal object and the time stamp for the signal object corresponding to this symbol, it is possible to additionally transmit the date (symbol) of the signal object having the second smallest distance and the time stamp for the signal object corresponding to this second most probable signal object. Thus, in this case, a list of hypotheses comprising two recognized signal objects and their temporal positions, as well as, in addition, allocated score values is transmitted to the computer system. Likewise, it is also possible to transmit to the computer system a list of hypotheses comprising more than two symbols for more than two recognized signal objects and their temporal positions, as well as, in addition, allocated score values.

Preferably the data of the recognized signal object class and of the allocated data, e.g. the time stamp and score of the respective recognized signal object classes, i.e. the signal object parameters, are transmitted according to the FIFO principle. This ensures that the data of the reflections of the nearest objects are always transmitted first and that in this manner the safety-critical case of a collision of the vehicle with an obstacle is processed prioritized according to probability.

Besides a transmission of measuring data, a transmission of error conditions of the sensor may also be performed. This may also be effected during a reception time $T_E$, if the sensor determines via self-test devices that a defect exists and the data previously transmitted are potentially faulty. Thus, it is ensured that the computer system can obtain information about a change in the evaluation of the measuring data at the earliest time possible and can reject them or treat them in some other way. This is of particular importance for emergency brake systems, since an emergency braking is a safety-critical operation that must only be initiated if the underlying data have a corresponding confidence value, and also for other driver assistance systems. Compared to that, the transmission of the measuring data, e.g. the date of the recognized signal object class, and/or the transmission of the single allocated signal object parameter are therefore postponed and thus given lower priority. Of course, an interruption of the transmission upon the occurrence of an error in the sensor is conceivable. However, an error may seem possible but its presence is not ascertained. As such, a continuation of transmission may possibly be advisable in such cases. The transmission of safety-critical errors of the sensor is thus performed with higher priority.

Besides the wavelets described before which have an integral value of 0 and the signal sections with an integral value different from 0, additionally denoted as wavelets herein, particular positions/phases in the profile of the reception signal may be conceived as basic signal objects in the sense of this disclosure which could be used for data compression and may be transmitted instead of sample values of the reception signal. This subset of the set of possible basic signal objects will be referred to hereinafter as signal profile points. Thus, in the sense of this disclosure, the signal profile points are a special form of basic signal objects.

A first possible signal profile point, and thus a basic signal object, is a crossing of the profile of a threshold value signal (SW) by the envelope signal (1) in an ascending direction.

A second possible signal profile point, and thus a basic signal object, is a crossing of the profile of a threshold value signal (SW) by the envelope signal (1) in a descending direction.

A third possible signal profile point, and thus a basic signal object, is a local or absolute maximum in the profile of the envelope signal (1) above the amplitude of a thirteenth threshold value signal (SW).

A fourth possible signal profile point, and thus a basic signal object, is a local or absolute minimum in the profile of the envelope signal (1) above a threshold value signal (SW).

For these four exemplary types of signal profile points and other types of signal profile points, it may possibly be feasible to use threshold value signals (SW) typical for basic signal objects.

The chronological sequence of basic signal objects is typically not optional. This may be used to advantage, since preferably not the basic signal objects, which are of a simpler nature, are to be transmitted, but recognized patterns of chronological sequences of these basic signal objects, which then represent the actual signal objects. If, for example, a triangular wavelet is expected in the envelope signal (1) having a sufficient amplitude, what can be expected, in addition to a corresponding minimum level at the output of a matched filter suited for the detection of such a triangular wavelet, in temporal correlation with the exceeding of said minimum level at the output of said matched filter is 1. the occurrence of a first possible signal profile point upon a threshold value signal (SW) being crossed by the amplitude of the envelope signal (1) in an ascending direction, and subsequent thereto
2. the occurrence of a second possible signal profile point at a maximum of the envelope signal (1) above the amplitude of a or the threshold value signal (SW), and subsequent thereto
3. the occurrence of a third possible signal profile point upon a or the threshold value signal (SW) being crossed by the amplitude of the envelope signal (1) in a descending direction.

In this example the exemplary signal object of a triangular wavelet thus consists of the predefines sequence of three basic signal objects by means of which a signal object is recognized and allocated to a signal object class, wherein this information is transmitted as a symbol of the signal object class and a parameter describing the recognized signal object, e.g. in particular the occurrence time, i.e. the time stamp. Besides, this exceeding of said minimum level at the output of said matched filter is another example for a fifth possible signal profile point and thus a further possible signal profile characteristic.

The resulting grouping and chronological sequence of recognized basic signal objects can itself be recognized, e.g. by a Viterbi decoder, as a predefined expected grouping or chronological sequence of basic signal objects and can thus itself be a basic signal object. As such, such a predefined grouping and/or chronological sequence of other basic signal objects is a sixth possible signal profile point and thus a basic signal object.

When such a grouping of signal profile characteristics or a chronological sequence of signal object classes is recognized, the transmission of the symbol for this recognized summarizing signal object class and of at least the one allocated signal object parameter is performed subsequently, preferably instead of a transmission of the individual basic signal objects, since significant data bus capacities are saved in this manner. There may be cases in which both are transmitted. Here, the date (symbol) of the signal object class of a signal object is transmitted, which is a predefined chronological sequence and/or grouping of other basic signal objects. To achieve compression, it is advantageous if at least one signal object class (symbol) of at least one of the other basic signal objects is not transmitted.

A chronological grouping of basic signal objects is given in particular if the temporal distance of these basic signal objects does not exceed a predefined distance. In the above-mentioned example consideration should be given to the propagation time of the signal in the matched filter. Typically, the matched filter should be slower than the comparators. Therefore, the change in the output signal of the matched filter should have a fixed chronological correlation with the temporal occurrence of the relevant signal profile points.

In an example, a method for transmitting sensor data, in particular of an ultrasonic sensor, from a sensor to a computer system, in particular in a vehicle, is provided which starts after emission of an ultrasonic burst and reception of an ultrasonic signal and forming of a time-discrete reception signal consisting of a sequence of sample values. A temporal date (time stamp) is allocated to each sample value. The method starts with the determination of at least two parameter signals, each regarding the presence of respectively one basic signal object allocated to the respective parameter signal, using at least one suitable filter (e.g. a matched filter) from the sequence of sample values of the reception signal. The resultant parameter signals (feature vector signals) are also configured as a time-discrete sequence of respective parameter signal values (feature vector values), each correlated with a date (time stamp). Thus, preferably exactly one temporal date (time stamp) is allocated to each parameter signal value (feature vector value). Hereinafter, these parameter signals will be referred to together as a feature vector signal. Thus, the feature vector signal is configured as a time-discrete sequence of feature vector signal values, each with n parameter signal values, which are composed of the parameter signal values and further parameter signal values each with identical temporal date (time stamp). Here, n is the dimensionality of the individual feature signal values which preferably are identical from one feature vector value to the next feature vector value. Each feature vector signal value thus formed has this respective temporal date (time stamp) allocated thereto. Subsequently, the temporal profile of the feature vector signal in the resultant n-dimensional phase space is evaluated and a recognized signal object is concluded upon while determining an evaluation value (e.g. the distance). As explained above, a signal object is formed by a temporal sequence of basic signal objects. Typically a predefined symbol is allocated to the signal object. In metaphorical terms, it is examined whether, on its path through the n-dimensional space, the point the n-dimensional feature vector signal points to in the n-dimensional phase space approaches, in a predetermined chronological sequence, predetermined points in this n-dimensional phase space to a distance smaller than a predetermined maximum distance. The feature vector signal this has a temporal profile. Thereafter, an evaluation value (e.g. a distance) is calculated which can e.g. indicate the probability of the presence of a certain sequence. Subsequently, this evaluation value, to which a temporal date (time stamp) is again allocated, is compared to a threshold value vector while forming a Boolean result which may have a first and a second value. If this Boolean result for this temporal date (time stamp) has the first value, the symbol of the signal object and the temporal date (time stamp) allocated to that symbol are transmitted from the sensor to the computer system. If so desired, further parameters can be transmitted depending on the recognized signal object.

It is particularly preferred that the data transmission in the vehicle is performed via a serial bidirectional single-wire data bus. The electric return path is preferably ensured by the vehicle body. Preferably the sensor data are transmitted to the computer system in a current-modulated state. The data for controlling the sensor are transmitted to the sensor by the computer system preferably in a voltage-modulated state. It has been found that the use of a PSI5 data bus and/or of a DSI3 data bus is particularly suitable for data transmission. Moreover, it has been found that it is particularly advantageous to perform the transmission of the data to the computer system at a transmission rate of >200 kBit/s and to perform transmission of the data from the computer system to the at least one sensor at a transmission rate of >10 kBit/s, preferably >20 kBit/s. Further, it has been found that the transmission of data from the sensor to the computer system should be modulated on the data bus whose current is less than 50 mA, preferably less than 5 mA, more preferred less than 2.5 mA. These busses have to be adapted to these operating values in a corresponding manner. However, the basic principle remains the same. For the execution of the above described methods a computer system with a data interface to the above-mentioned data bus, preferably said single-wire data bus, is required which supports the decompression of the data thus compressed. Generally, however, the computer system will not perform a full decompression but evaluate e.g. only the time stamp and the recognized signal object type. The sensor required to execute one of the above described methods comprises at least one transmitter and at least one receiver for generating a reception signal, which may also be implemented in combination as one or a plurality of transducers. Further, the sensor comprises at least devices for processing and compressing the reception signal, as well as a data interface for transmitting the data via the data bus, preferably said single-wire data bus, to the computer system. For compression, the compression device preferably comprises at least one of the following units:

matched filters,
comparators,
threshold value signal generating devices for generating one or a plurality of threshold value signals (SW),
differentiators for forming derivatives,
integrators for forming integrated signals,
other filters,
envelope formers for generating an envelope signal from the reception signal,
correlation filters for comparing the reception signal or signals derived therefrom with reference signals.

An example method for transmitting sensor data, in particular of an ultrasonic sensor, from a sensor to a computer system, in particular in a vehicle, can be executed as follows:

Preceding steps are, for example, the emission of an ultrasonic burst and the reception of an ultrasonic signal, i.e. typically a reflection, as well as forming a time-discrete reception signal consisting of a temporal sequence of sample values. Here, a temporal date (time stamp) is allocated to each sample value. The same typically indicates the time of sampling. Based on this data stream, a first characteristic of a first parameter signal is determined using a first filter from the sequence of sample values of the reception signal. Preferably, the parameter signal is again formed as a time-discrete sequence of parameter signals. Again, exactly one temporal date (time stamp) is allocated to each parameter signal value. It is preferred that this date corresponds to the most recent temporal date of a sample value used to form this respective parameter signal value. At the same time, preferably at least one further parameter signal and/or a characteristic allocated to this further parameter signal are determined using another filter, allocated to this further parameter signal, from the sequence of sample values of the reception signal, the further parameter signals each again being formed as time-discrete sequences of further parameter signal values. Again, the same temporal date (time stamp) that is allocated to the corresponding parameter signal value is also allocated to each further parameter signal value, respectively.

Hereinafter, the first parameter signal and the further parameter signals will together be referred to as parameter vector signal or as feature vector signal. This feature vector signal thus is a time-discrete sequence of feature vector signal values formed by the parameter signal values and further parameter signal values, each with the same temporal date (time stamp). Thus, this respective temporal date (time stamp) can be associated with each feature vector signal value thus formed, i.e. each parameter signal value.

Preferably, thereafter a quasi-continuous comparison of the feature vector signal values of a temporal date (time stamp) to a threshold value vector, which preferably is a prototype vector, while obtaining a Boolean result that can have a first and a second value. For example, it is conceivable to compare the amount of the present feature vector signal value, which e.g. represents a first component of a feature vector signal value, to a threshold value, which represents a first component of the threshold value vector, and to set the Boolean result to a first value, if the amount of the feature vector signal value is smaller than this threshold value, and to set it to a second value, if this is not the case. If the Boolean result has a first value, it is further conceivable to compare the amount of the further feature vector signal, which represents e.g. a further component of this feature vector signal, to a further threshold value, which represents a further component of the threshold value, and to either leave the Boolean result at the first value, if the amount of the further feature vector signal is smaller than this further threshold value, or to set the Boolean result to the second value, if this is not the case. In this manner, all further feature vector signal values can be checked. Of course, other classifiers are also conceivable. A comparison to a plurality of different threshold value vectors is possible, as well. These threshold value vectors thus represent the prototypes of predetermined signal waveforms. They come from the above-mentioned library. Preferably, again, each threshold value vector has a symbol allocated thereto.

As the last step in this case, the symbol and possibly also the feature vector signal values and the temporal date (time stamp) allocated to this symbol or feature vector signal value are transmitted from the sensor to the computer system, if the Boolean result for this temporal date (time stamp) has the first value.

Thus, all other data are not transmitted (anymore). Further, interferences are avoided by the multi-dimensional evaluation.

On this basis a sensor system is thus proposed which comprises at least one computer system configured to perform one of the previously described methods, and at least two sensors also configured to perform one of the previously described methods, so that these at least two sensors can communicate with the computer system via signal object recognition and are also enabled to transmit extraneous echoes in a compact manner and to provide the computer system with this additional information. Accordingly, the sensor system is typically provided to ensure that the data transmission between the at least one sensor and the computer system is performed or can be performed according to the methods described before. In the at least two sensors of the sensor system, typically, one ultrasonic reception signal is transmitted, respectively, i.e. at least two ultrasonic reception signals, is compressed using one of the above proposed methods and is transmitted to the computer system. Here, in the computer system, the at least two ultrasonic reception signals are reconstructed into ultrasonic reception signals. Then, the computer system performs an object recognition of objects in the environment of the sensors, using reconstructed ultrasonic reception signals. Contrary to prior art, the sensors thus do not perform the object recognition. They merely provide the data regarding the encoding of recognized signal objects and their parameters and thus transmit the reception signal profile in a compressed manner.

In addition, the computer system preferably performs a recognition of objects, i.e. obstacles in the environment of the sensors, using the reconstructed ultrasonic reception signals and possibly additional signals of further sensors, in particular the signals of radar sensors.

As a last step, based on the recognized objects, the computer system preferably creates an environment map for the sensors or a device to which the sensors belong or which has the sensors as a part thereof.

The compressed transmission of signal profile data between a sensor and the computer system via the data bus, reduces the data bus load and thus the criticality with respect to EMC requirements on the one hand and, on the other hand, creates free data bus capacities for the transmission of control commands from the computer system to the sensor and for the transmission of status information and other data from the sensor to the computer system. The proposed prioritization with which the compressed data of the reception signal profile and other data such as status information and error messages are transmitted ensures that safety-relevant date are transmitted first and thus no unnecessary dead times of the sensor are caused.

FIG. 3a illustrates the temporal profile of a conventional ultrasonic echo signal (1) (see the wider solid line) and the conventional evaluation thereof in arbitrary units. Starting with the emission of the transmission burst (SB) (see the left-most signal profile section and the reference SB in FIG. 3d), a threshold value signal (SW) (see the broken line) is transmitted along. Every time the envelope signal of the ultrasonic echo signal (1) exceeds the threshold value signal (SW), the output (2) (see the finer solid line) is set to logical 1. This is a temporally analog interface with a digital output level. The further evaluation is then performed in the control device of the sensor. An indication of errors or a control of the sensor is not possible via the analog interface that corresponds to prior art.

FIG. 3b illustrates the temporal profile of a conventional ultrasonic echo signal (1) and the conventional evaluation thereof in arbitrary units. Starting with the emission of the transmission burst (SB), a threshold value signal (SW) is transmitted along. Every time the envelope signal of the ultrasonic echo signal (1) exceeds the threshold value signal (SW), the output (2) is now, however, set to a level corresponding to the magnitude of the detected reflection (see the wider chain-dotted line). This is a temporally analog interface with a digital output level. The further evaluation is then performed in the sensor. An indication of errors or a control of the sensor is not possible via the analog interface that corresponds to prior art.

FIG. 3c is an explanatory illustration of the ultrasonic echo signal, wherein the direction of chirp (e.g. A=chirp up; B=chirp down) is marked by hatch lines from top left to bottom right and from bottom left to top right, respectively.

In FIG. 3d, the principle of the symbolic signal transmission is explained. Instead of the signal in FIG. 3c, only two types of (triangular) signal objects are transmitted as examples. Specifically, these are a first triangular object (A) (illustrated in FIG. 3d both for the chirp-up case and the chirp-down case) and a second triangular object (B) (illustrated for the chirp-down case). At the same time, the time and the peak values, as well as possible the base width of the triangular object are transmitted. When the signal is reconstructed on the basis of these data, a signal corresponding to FIG. 3*d* is obtained. Those signal portions that did not correspond to the triangular signals were removed from this signal. Thus, signal portions not recognized were rejected, which leads to massive data compression.

Figure 4:
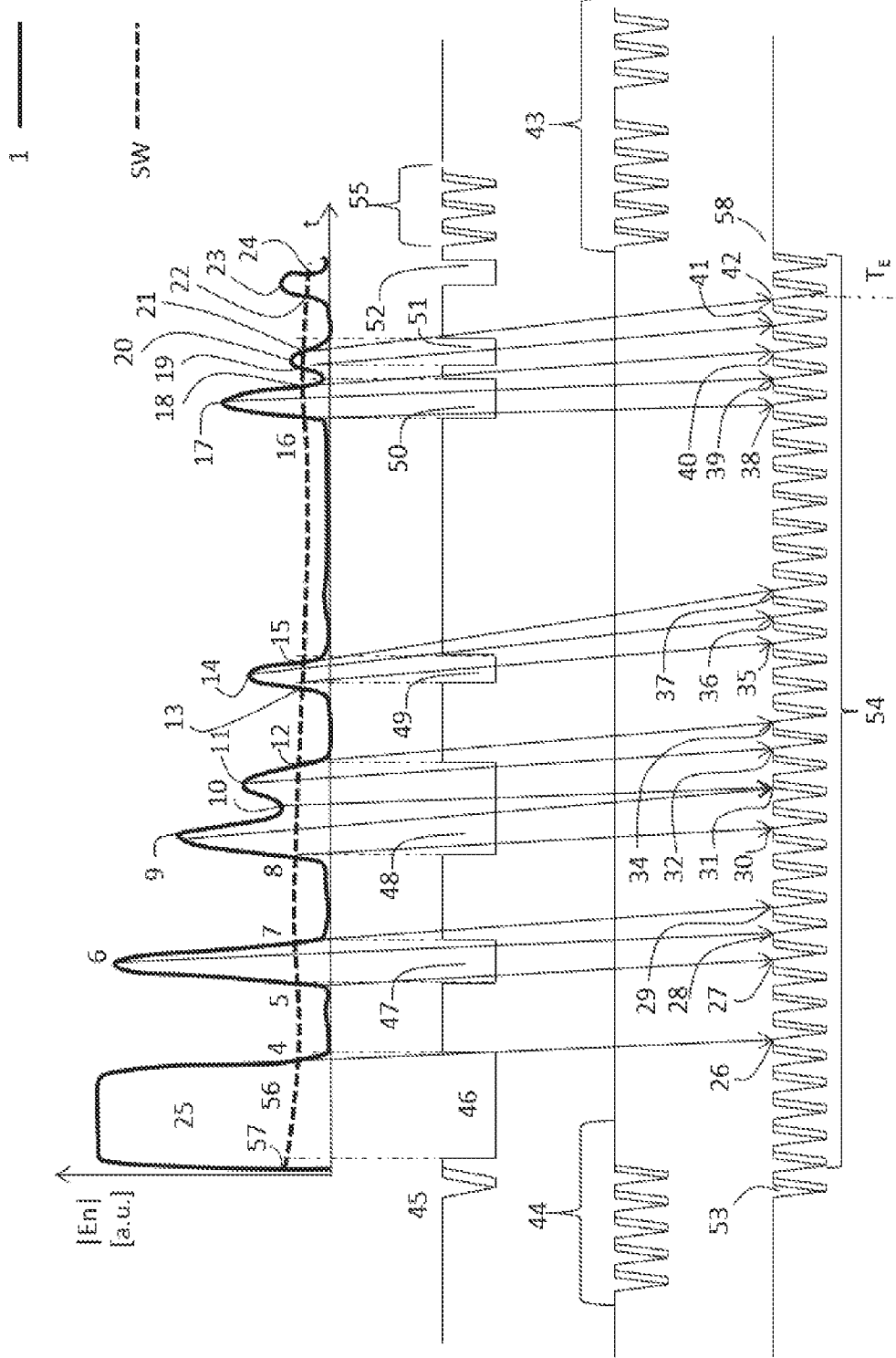

FIG. 4*a* illustrates the conventional analog transmission of the intersections of the envelope signal (1) of the ultrasonic echo signal with the threshold signal (SW).

FIG. 4*b* illustrates the transmission of analyzed data after complete reception of the ultrasonic echo.

FIG. 4*c* illustrates the transmission of compressed data, wherein in this example symbols for basic signal objects are transmitted mostly without compression.

Figure 5:
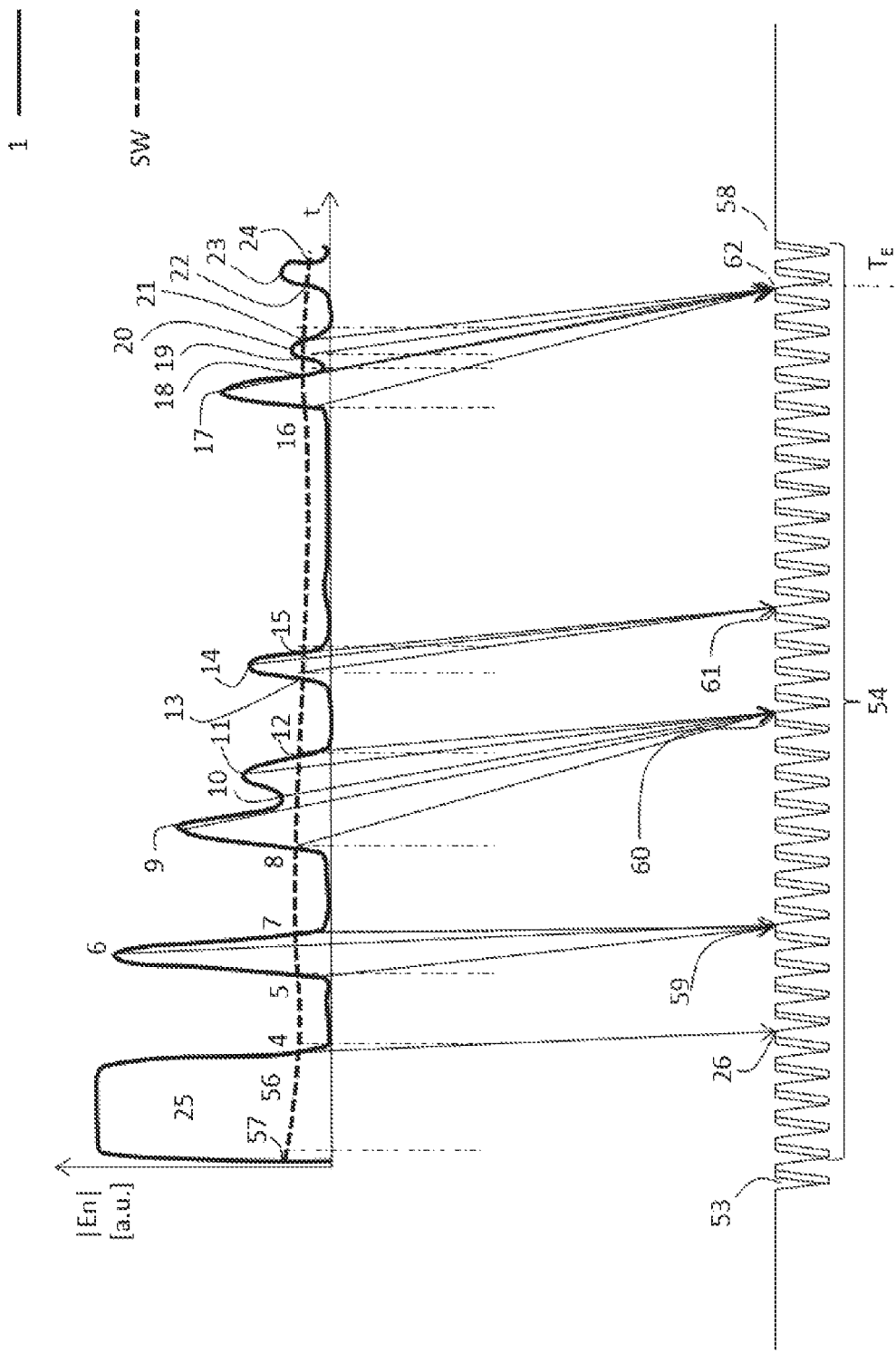

FIG. 5 illustrates the transmission of compressed data, wherein in this example symbols for basic signal objects are compressed to form symbols for signal objects. First, a first triangular object (59) characterized by the temporal sequence of the threshold value exceedance, the maximum and the threshold value undershoot (see the temporal sequence of the signal profile points 5, 6, 7 in the signal profile of the ultrasonic echo signal in the upper diagram of FIG. 5) is recognized and transmitted. Thereafter, a double peak with a saddle point (60) above the threshold value signal is recognized. Here, the sequence of the exceedance of the threshold value (SW) by the envelope signal (1), the maximum of the envelope signal (1), the minimum above the threshold value signal (SW) and the undershooting of the threshold value signal (SW) (see the signal profile points 8, 9, 10, 11, 12 in the upper diagram) is characteristic. After recognition, the symbol for this double peak with saddle point is transmitted. In doing so, a time stamp is transmitted along. Preferably, further parameters of the double peak with saddle point are also transmitted along, e.g. the positions of the maxima and of the minimum or a scaling factor. Thereafter, a triangular signal (61) (i.e. a basic signal object) is again recognized as an exceedance of the threshold value signal (SW) by the envelope signal (1), again followed by the undershooting of the threshold value signal (SW) by the envelope signal (1) (see the signal profile points 13, 14 15 in the upper diagram). This is again followed by the recognition of a double peak (62), however, with the minimum of the envelope signal being below the threshold value signal (SW) (see the signal profile points 16, 17, 18, 19, 20, 21 in the upper diagram). Thus, this double peak can be treated e.g. as a separate signal object. Finally, the triangular signal is recognized from the signal profile points 22, 23, 24 of the upper diagram. It can easily be seen that this treatment of the signal results in massive data reduction.

Figure 3:
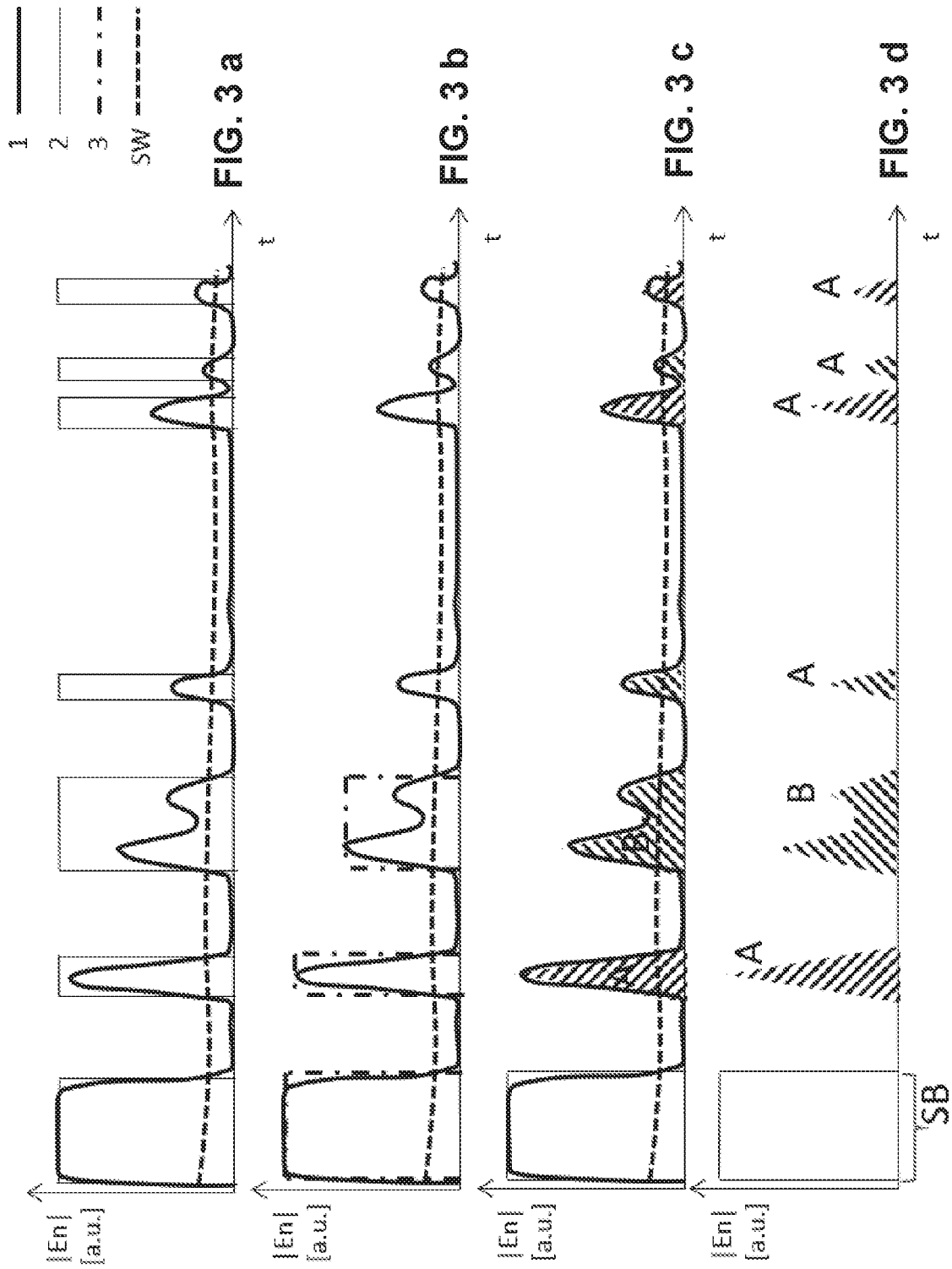
Figure 6:
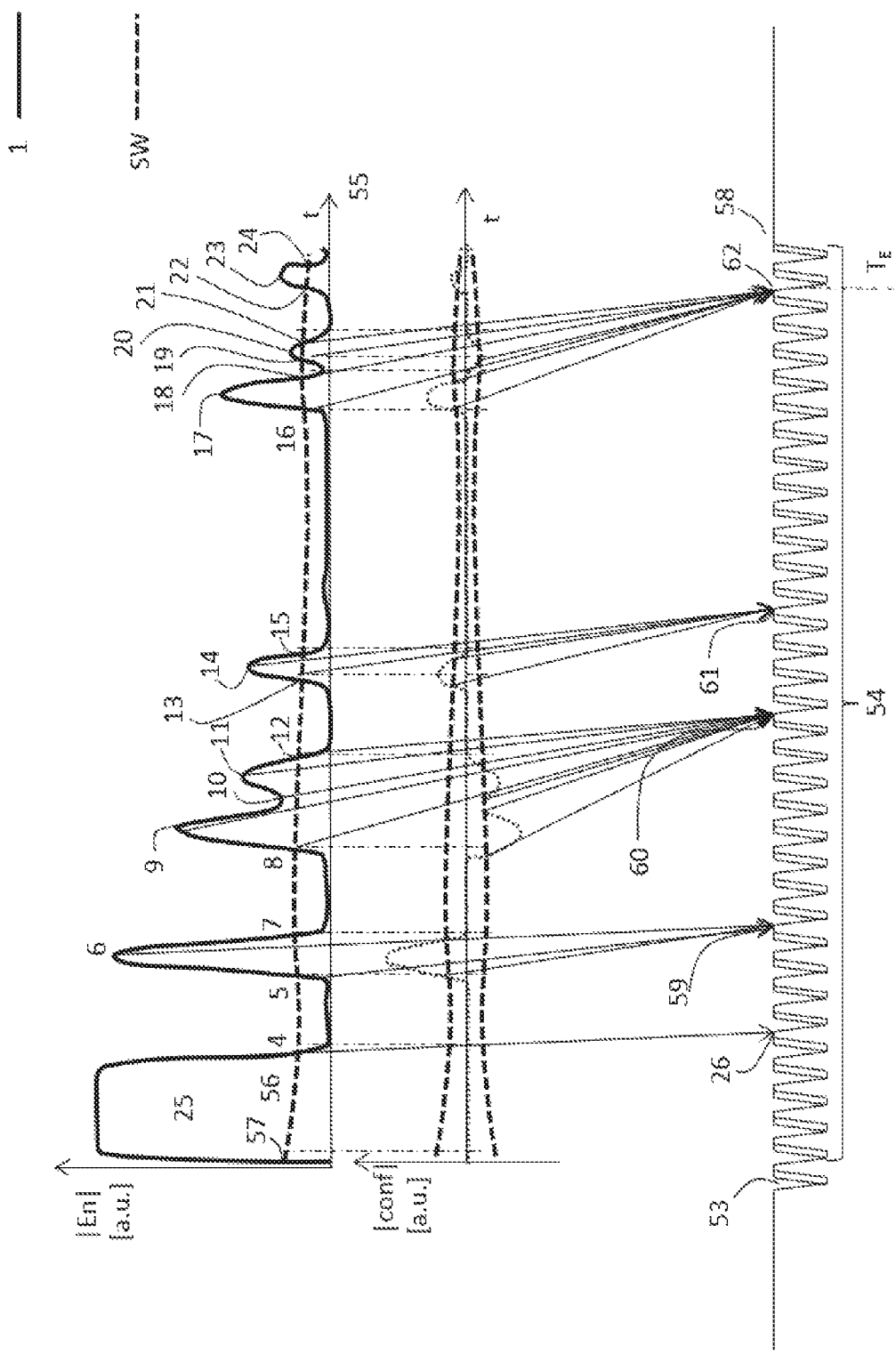

FIG. 6 illustrates the transmission of compressed data corresponding to FIG. 3, wherein in this example not only the envelope signal, but also a confidence signal is evaluated. In the top and middle diagrams in FIG. 6, thick broken lines indicate threshold value signals. It can be seen that the reception signal is evaluated only if it exceeds the threshold value signal. The dotted signal profile line in the middle diagram in FIG. 6 indicates that a signal object is modulated with chirp up or with chirp down (cf. also FIGS. 3*c* and 3*d* in which chirp up and chirp down are differentiated by the different oblique hatchings). An upward directed dotted signal profile line indicates that the signal object has been recognized as being chirp-up modulated, whereas a downward directed signal profile line indicated that the signal object has been recognized as being chirp-down modulated.

It should be noted regarding the above and the following that the terms are defined as follows:
  signal object is also referred to as signal profile object
  signal object class is also referred to as signal profile object class
  symbol is the identifier of the signal profile object class
  signal object parameters is synonymous with object parameter
  basic signal waveform means a signal profile characteristic.

Per definition a signal object is formed by two or a plurality of basic signal objects, i.e. a signal profile object is formed by one or a plurality of signal profile characteristics. A signal object belongs to one of a plurality of signal object classes. A signal object can be described by one or a plurality of signal object parameters, i.e. regarding the position, the magnitude, distortion and stretching.

A basic signal object can also be referred to as a basic signal profile feature, i.e. signal profile characteristic.

Parameter additionally describe the shape of the signal object.

A parameter signal consists of a plurality of parameter signal values.

A feature vector signal consists of a plurality of parameter signals.

A value of the feature vector signal consists of a plurality of parameter signal values.

A plurality of parameter signals forms the feature vector signal. A feature vector signal value, also referred to as parameter vector signal value, comprises a plurality of parameter signal values.

Individual examples according to the disclosure will be indicated hereinafter, while it should be noted that the individual groups of features indicated below can be combined among each other as desired (the reference numerals refer to the illustrations in FIGS. 1 and 2 and should be understood as merely exemplary, I.e. not restrictive):

1. Method for transmitting sensor data, in particular of an ultrasonic sensor, from a sensor to computer system, in particular in a vehicle, comprising the steps of
   emitting an ultrasonic burst;
   receiving an ultrasonic sensor and forming a reception signal;
   performing data compression of the reception signal to generate compressed data;
   transmitting the compressed data to the computer system.

2. Method for transmitting sensor data, in particular of an ultrasonic sensor, from a sensor to computer system, in particular in a vehicle, comprising the steps of
   emitting an ultrasonic burst with a start 57 and an end 56 of the emission of the ultrasonic burst;
   receiving an ultrasonic signal and forming of a reception signal for a reception time $T_E$ at least from the end 56 of the emission of the ultrasonic burst;
   transmitting the compressed data via a data bus, in particular a single-wire data bus, to the computer system;
   wherein the transmission 54 of the data from the sensor to the computer system
   starts after a start command 53 from the computer system to the sensor via the data bus and prior to the end 56 of the emission of the ultrasonic burst, or
   starts after a start command 53 from the computer system to the sensor via the data bus and prior to the start 57 of the emission of the ultrasonic burst, and,
   after the start command 53, the transmission 54 is performed in a periodically ongoing manner until the end of the data transmission 58;

wherein this end of the data transmission 58 comes chronologically after the end of the reception time $T_E$.

3. Method for transmitting sensor data, in particular of an ultrasonic sensor, from a sensor to computer system, in particular in a vehicle, comprising the steps of
   emitting an ultrasonic burst;
   receiving an ultrasonic sensor and forming a reception signal;
   forming a feature vector signal from the reception signal;
   recognizing and classifying signal profile characteristics in recognized signal profile characteristic classes within the reception signal, wherein at least one allocated signal profile characteristic parameter is allocated to each recognized signal profile characteristics or is determined for this signal profile characteristic,
   performing prioritized transmission of at least one recognized signal profile characteristic class and at least the one allocated signal profile characteristic parameter.

4. Method in accordance with number 3, wherein at least one of the allocated signal profile characteristic parameters that is transmitted with the at least one recognized signal profile characteristic class is a time value indicating a temporal position that is suited to conclude therefrom on the time since the emission of a preceding ultrasonic burst.

5. Method in accordance with number 4, comprising the additional step of determining a distance of an obstacle object in dependence on the time value.

6. Method in accordance with number 3, comprising the step of determining a chirp value as the allocated signal profile characteristic parameter which indicates, whether the signal profile characteristic recognized is an echo of an ultrasonic transmission burst with chirp-up or chirp-down or no-chirp features.

7. Method in accordance with number 3, comprising the step of generating a confidence signal by forming the correlation between the reception signal or a signal derived therefrom and a reference signal.

8. Method in accordance with number 3, comprising the step of generating a phase signal.

9. Method in accordance with number 8, comprising the step of generating a phase confidence signal by forming the correlation between the phase signal or a signal derived therefrom and a reference signal.

10. Method in accordance with number 9, comprising the step of comparing the phase confidence signal to one or a plurality of threshold values for generating a discretized phase confidence signal.

11. Method in accordance with number 3, comprising the steps of
    forming at least one binary, digital or analog distance value between the feature vector signal and one or a plurality of signal profile characteristic prototype values for recognizable signal profile characteristic classes;
    allocating a recognizable signal profile characteristic class as a recognized signal profile characteristic, if the distance value undershoots one or a plurality of predetermined binary, digital or analog distance values.

12. Method in accordance with number 3, wherein at least one signal profile characteristic class is a wavelet.

13. Method in accordance with number 3, wherein the at least one wavelet is a triangular wavelet.

14. Method in accordance with number 12, wherein the at least one wavelet is a rectangular wavelet.

15. Method in accordance with number 12, wherein the at least one wavelet is a half sine wavelet.

16. Method in accordance with number 12, wherein one of the signal object parameters
    is a temporal shift of the wavelet of the recognized signal profile characteristic, or
    is a temporal compression or stretching of the wavelet of the recognized signal profile characteristic, or
    is an amplitude of the wavelet of the recognized signal profile characteristic.

17. Method in accordance with number 3, wherein the transmission of the at least one recognized signal profile characteristic class and at least the one allocated signal profile characteristic parameter is performed according to the FIFO principle.

18. Method in accordance with number 3, wherein the transmission of error conditions of the sensor is performed with higher priority than
    the transmission of the at least one recognized signal profile characteristic class and/or
    the transmission of the one allocated signal profile characteristic parameter.

19. Method in accordance with number 3, wherein a signal profile characteristic is the amplitude of the envelope signal 1 crossing the amplitude of a threshold value signal SW in an ascending direction.

20. Method in accordance with number 3, wherein a signal profile characteristic is the amplitude of the envelope signal 1 crossing the amplitude of a threshold value signal SW in a descending direction.

21. Method in accordance with number 3, wherein a signal profile characteristic is a maximum of the amplitude of the envelope signal 1 above the amplitude of a threshold value signal SW.

22. Method in accordance with number 3, wherein a signal profile characteristic is a minimum of the amplitude of the envelope signal 1 above the amplitude of a threshold value signal SW.

23. Method in accordance with number 3, wherein a signal profile characteristic is a predefined temporal sequence and/or temporal grouping of other signal profile characteristics.

24. Method in accordance with number 23, wherein the transmission of the at least one recognized signal profile characteristic class and at least the one allocated signal profile characteristic parameter is the transmission of the signal profile characteristic class of a signal profile characteristic which is a predefined sequence of other signal profile characteristics, and wherein at least one signal profile characteristic class of at least one of these other signal profile characteristics is not transmitted.

25. Method in accordance with number 1 or 3, wherein the data transmission is performed via a bidirectional single-wire data bus, in which the sensor transmits the data to the computer system in a current-modulated manner, and in which the computer system transmits data to the sensor in a voltage modulated manner.

26. Method in accordance with number 25, characterized by the use of a PSI5 data bus and/or a DSI3 data bus for data transmission.

27. Method in accordance with number 25, wherein the transmission of the data to the computer system is performed at a transmission rate of >200 kBit/s, and is performed at a transmission rate of >10 kBit/s, preferably 20 kBit/s from the computer system to the at least one sensor.

28. Method in accordance with number 25, wherein, for the transmission of date from the sensor to the computer system, a transmission current is modulated on the data bus, and wherein the current intensity of the transmission current is <50 mA, preferably <5 mA.

29. Sensor, in particular ultrasonic sensor, suitable for performing a method in accordance with one or more of numbers 1 to 28.

30. Computer system suitable for performing a method in accordance with one or more of numbers 1 to 28.

31. Method for transmitting sensor data, in particular of an ultrasonic sensor, from a sensor to computer system, in particular in a vehicle, with or comprising the steps of
emitting an ultrasonic burst α;
receiving an ultrasonic sensor and forming a reception signal β;
performing data compression of the reception signal to generate compressed data γ;
transmitting the compressed data to the computer system δ.

32. Method for transmitting sensor data, in particular of an ultrasonic sensor, from a sensor to computer system, in particular in a vehicle, with or comprising the steps of
emitting an ultrasonic burst with a start 57 and an end 56 of the emission of the ultrasonic burst α;
receiving an ultrasonic signal and forming a reception signal for a reception time $T_E$ at least from the end 56 of the emission of the ultrasonic burst β;
transmitting the compressed data via a data bus, in particular a single-wire data bus, to the computer system γ, δ;
wherein the transmission 54 of the data from the sensor to the computer system
starts after a start command 53 from the computer system to the sensor via the data bus and prior to the end 56 of the emission of the ultrasonic burst, or
starts after a start command 53 from the computer system to the sensor via the data bus and prior to the start 57 of the emission of the ultrasonic burst, and,
wherein, after the start command 53, the transmission 54 is performed in a periodically ongoing manner until the end of the data transmission 58, and
wherein this end of the data transmission 58 comes chronologically after the end of the reception time $T_E$.

33. Method for transmitting sensor data, in particular of an ultrasonic sensor, from a sensor to computer system, in particular in a vehicle, with or comprising the steps of
emitting an ultrasonic burst;
receiving an ultrasonic sensor and forming a reception signal;
forming a feature vector signal from the reception signal;
recognizing and classifying signal profile characteristics in recognized signal object classes within the reception signal,
wherein, to each signal object thus recognized and classified, at least one allocated signal object parameter and one symbol are allocated corresponding to the signal object class allocated to this signal object or
wherein, for each signal object thus recognized and classified, at least one allocated signal object parameter and a symbol for this signal object are determined;
transmitting at least the symbol of a recognized signal object class and at least the one allocated signal object parameter of this recognized signal object class.

34. Method in accordance with number 33, wherein the transmission of at least the symbol of a recognized signal object class and at least the one allocated signal object parameter of this recognized signal object class is performed in a prioritized manner.

35. Method in accordance with one or more of numbers 33 to 34, wherein at least one of the allocated signal object parameters that is transmitted with the at least one recognized signal object class is a time value indicating a temporal position that is suited to conclude therefrom on the time since the emission of a preceding ultrasonic burst.

36. Method in accordance with one or more of numbers 34 or 35, comprising the additional step of
determining a determined distance of an object in dependence on the time value.

37. Method in accordance with one or more of numbers 33 to 36, comprising the additional step of
determining a chirp value as the allocated signal object parameter which indicates, whether the signal object recognized is an echo of an ultrasonic transmission burst with chirp-up or chirp-down or no-chirp features.

38. Method in accordance with one or more of numbers 33 to 37, comprising the additional step of
generating a confidence signal by forming the correlation between the reception signal or a signal derived therefrom and a reference signal.

39. Method in accordance with one or more of numbers 33 to 38, comprising the additional step of
generating a phase signal.

40. Method in accordance with number 39, comprising the additional step of
generating a phase confidence signal by forming the correlation between the phase signal or a signal derived therefrom and a reference signal.

41. Method in accordance with number 40, comprising the additional step of
comparing the phase confidence signal to one or a plurality of threshold values for generating a discretized phase confidence signal.

42. Method in accordance with one or more of numbers 33 to 41, comprising the additional steps of
forming at least one binary, digital or analog distance value between the feature vector signal and one or a plurality of signal object prototype values for recognizable signal object classes;
allocating a recognizable signal object class as a recognized signal object, if the amount of the distance value undershoots one or a plurality of predetermined binary, digital or analog distance values.

43. Method in accordance with one or more of numbers 33 to 42, wherein at least one signal object class is a wavelet.

44. Method in accordance with number 43, wherein the at least one wavelet is a triangular wavelet.

45. Method in accordance with one or more of numbers 43 to 44, wherein the at least one wavelet is a rectangular wavelet.

46. Method in accordance with one or more of numbers 43 to 46, wherein the at least one wavelet is a half sine wavelet.

47. Method in accordance with one or more of numbers 43 to 46, wherein one of the signal object parameters
is a temporal shift of the wavelet of the recognized signal object, or
is a temporal compression or stretching of the wavelet of the recognized signal object, or
is an amplitude of the wavelet of the recognized signal object.

48. Method in accordance with one or more of numbers 33 to 47, wherein the transmission of the at least one recognized signal object class and at least the one allocated signal object parameter is performed according to the FIFO principle, wherein the FIFO principle means that recognized signal object classes with an earlier time stamp are transmitted earlier than recognized signal object classes with a later time stamp.
49. Method in accordance with one or more of numbers 33 to 48, wherein the transmission of error conditions of the sensor is performed with higher priority than
the transmission of the at least one recognized signal object class and/or
the transmission of the one allocated signal object parameter.
50. Method in accordance with one or more of numbers 33 to 49, wherein a signal object comprises a combination of two or three or four or more basic signal objects.
51. Method in accordance with number 50, wherein a basic signal object is the intersection of the amount of the amplitude of the envelope signal 1 with the amount of a threshold value signal SW at a time of crossing.
52. Method in accordance with one or more of numbers 50 to 51, wherein a basic signal object is the intersection of the amount of the amplitude of the envelope signal 1 with the amount of a threshold value signal SW at a time of crossing in an ascending direction.
53. Method in accordance with one or more of numbers 50 to 52, wherein a basic signal object is the intersection of the amount of the amplitude of the envelope signal 1 with the amount of a threshold value signal SW at a time of crossing in a descending direction.
54. Method in accordance with one or more of numbers 50 to 53, wherein a basic signal object is a maximum of the amount of the amplitude of the envelope signal 1 above the amount of a threshold value signal SW at a time of maximum.
55. Method in accordance with one or more of numbers 50 to 54, wherein a basic signal object is a minimum of the amount of the amplitude of the envelope signal 1 above the amount of a threshold value signal SW at a time of minimum.
56. Method in accordance with one or more of numbers 50 to 55, wherein a basic signal object is a predefined temporal sequence and/or temporal grouping of other signal objects.
57. Method in accordance with one or more of numbers 33 to 56, wherein the transmission of at least the symbol of a recognized signal object class and at least the one allocated signal object parameter of this recognized signal object class is the transmission of the signal object class of a signal object which is a predefined temporal sequence of other signal objects, and wherein at least one signal object class of at least one of these other signal objects is not transmitted.
58. Method in accordance with one or more of numbers 31 to 57, wherein
the data transmission is performed via a bidirectional single-wire data bus,
in which the sensor transmits the data to the computer system in a current-modulated manner, and
in which the computer system transmits data to the sensor in a voltage modulated manner.
59. Method in accordance with number 58, characterized by the use of a PSI5 data bus and/or a DSI3 data bus for data transmission.
60. Method in accordance with one or more of numbers 58 or 59, wherein the transmission of the data to the computer system is performed at a transmission rate of >200 kBit/s, and is performed at a transmission rate of >10 kBit/s, preferably 20 kBit/s from the computer system to the at least one sensor.
61. Method in accordance with one or more of numbers 58 or 59 or 60, wherein, for the transmission of date from the sensor to the computer system, a transmission current is modulated on the data bus, and wherein the current intensity of the transmission current is <50 mA, preferably <5 mA.
62. Method for transmitting sensor data, in particular of an ultrasonic sensor, from a sensor to computer system, in particular in a vehicle, with or comprising the steps of emitting an ultrasonic burst;
receiving an ultrasonic signal and forming a time-discrete reception signal formed by a sequence of sample values,
wherein a temporal date (time stamp) is allocated to each sample value;
determining a first parameter signal of a first feature using a first filter from the sequence of sample values of the reception signal,
wherein the parameter signal is configured as a time-discrete sequence of parameter signal values, and
wherein exactly one temporal date (time stamp) is allocated to each parameter signal value;
determining at least one further parameter signal of a feature allocated to this further parameter signal from the sequence of sample values of the reception signal, using a further filter allocated to this further parameter signal,
wherein the further parameter signals are each configured as time-discrete sequences of further parameter signal values, and
wherein the same temporal date (time stamp) that is allocated to the corresponding parameter signal value is also allocated to each further parameter signal value, respectively, and
wherein, hereinafter, the first parameter signal and the further parameter signals are referred to together as a feature vector signal, and
wherein the feature vector signal is thus configured as a time-discrete sequence of parameter vector signal values, also referred to hereinafter as feature vector signal values, formed by the parameter signal values and further parameter signal values each with the same temporal date (time stamp), and
wherein this respective temporal date (time stamp) is allocated to each feature vector signal value thus formed;
comparing the feature vector signal values of a temporal date to a threshold value vector while forming a Boolean result which may take a first and a second value;
transmitting the feature vector signal values and the temporal date (time stamp) allocated to this feature vector signal value from the sensor to the computer system, if the Boolean result for this temporal date (time stamp) has the first value.
63. Method for transmitting sensor data, in particular of an ultrasonic sensor, from a sensor to computer system, in particular in a vehicle, with or comprising the steps of emitting an ultrasonic burst;
receiving an ultrasonic signal and forming a time-discrete reception signal formed by a sequence of sample values,
wherein a temporal date (time stamp) is allocated to each sample value;

determining at least two parameter signals, each referring to the presence of respectively one basic signal object allocated to the respective parameter signal using at least one filter from the sequence of sample values of the reception signal,
   wherein the parameter signal is configured as a time-discrete sequence of respective parameter signal values, and
   wherein exactly one temporal date is allocated to each parameter signal value;
wherein, hereinafter, the first parameter signal and the further parameter signals are referred to together as a feature vector signal, and
wherein the feature vector signal is thus configured as a time-discrete sequence of feature vector signal values formed by the parameter signal values and further parameter signal values each with the same temporal date (time stamp), and
wherein this respective temporal date (time stamp) is allocated to each feature vector signal value thus formed;
evaluating the temporal profile of the feature vector signal and concluding on a signal object which is formed by a temporal sequence of basic signal objects and to which a symbol is allocated, while determining an evaluation value (distance) with a temporal profile;
comparing the evaluation value of a temporal date (time stamp) to a threshold value vector, while forming a Boolean result which may take a first and a second value;
transmitting the symbol of the signal object and the temporal date (time stamp) allocated to this symbol from the sensor to the computer system, if the Boolean result for this temporal date has the first value.
64. Sensor, in particular an ultrasonic sensor, suitable or provided for performing a method in accordance with one or more of numbers 32 to 63.
65. Computer system suitable or provided for performing a method in accordance with one or more of numbers 32 to 63.
66. Sensor system
   with at least one computer system in accordance with number 63 and
   with at least two sensors in accordance with number 65,
   wherein the sensor system is provided to ensure that the data transmission between the sensors and the computer system is or can be executed in accordance with a method of one or more of numbers 32 to 63.
67. Sensor system in accordance with number 44,
   wherein, in the sensors, respectively one ultrasonic reception signal, i.e. at least two ultrasonic reception signals, is compressed and transmitted to the computer system using a method corresponding to a method in accordance with one or more of numbers 32 to 63, and
   wherein, in the computer system, the at least two ultrasonic reception signals are reconstructed into reconstructed ultrasonic reception signals.
68. Sensor system in accordance with number 67, wherein the computer system performs an object recognition of objects in the environment of the sensors, using reconstructed ultrasonic reception signals.
69. Sensor system in accordance with number 68, wherein the computer system performs an object recognition of objects in the environment of the sensors, using reconstructed ultrasonic reception signals and additional sensor signals of further sensors, in particular signals from radar sensors.
70. Sensor system in accordance with one or more of numbers 68 or 69, wherein, on the basis of the recognized objects, the computer system creates an environment map for the sensors or a device of which the sensors are a part.

LIST OF REFERENCE NUMERALS

α emission of ultrasonic burst
β reception of the ultrasonic burst reflected at an object and conversion into an electric reception signal
γ compression of the electric reception signal and forming a sampled electric reception signal, wherein, preferably, a time stamp can be allocated to each sample value of the electric reception signal
γb determination of a plurality of spectral values e.g. by means of matched filters for signal object classes. This plurality of spectral values together forms a feature vector. This forming is preferably performed continuously so that a stream of feature vector values is obtained. Preferably, a time stamp value can again be allocated to each feature vector value.
γc optional, bur preferably performed normalization of the feature vector spectral coefficients of the respective feature vector of a time stamp value prior to correlation with the signal object classes in the form of predetermined feature vector values of a prototype library
γd determination of the distance between the present feature vector value and the values of the signal object classes in the form of predetermined feature vector values of a prototype library
γe selection of the most similar signal object class in the form of a predetermined feature vector value of a (prototype) library with, preferably, a minimum distance to the present feature vector, and accepting the symbol for this signal object class as a recognized signal object together with the time stamp value as compressed data. If so desired, further data, in particular signal object parameters such as e.g. the amplitude thereof, can be accepted along as compressed data. These compressed data then form the compression of the reception signal
δ transmission of the compressed electric reception signal to the computer system
1 envelope of the received ultrasonic signal
2 output signal (transmitted information) of an IO interface according to prior art
3 transmitted information of a LIN interface according to prior art
4 first point of intersection of the envelope 1 of the reception signal with the threshold value signal SW in the descending direction
5 first point of intersection of the envelope 1 with the threshold value signal SW in the ascending direction
6 first maximum of the envelope 1 above the threshold value signal SW
7 second point of intersection of the envelope 1 with the threshold value signal SW in the descending direction
8 second point of intersection of the envelope 1 with the threshold value signal SW in the ascending direction
9 second maximum of the envelope 1 above the threshold value signal SW
10 first minimum of the envelope 1 above the threshold value signal SW
11 third maximum of the envelope 1 above the threshold value signal SW
12 third point of intersection of the envelope 1 with the threshold value signal SW in the descending direction 13 third point of intersection of the envelope 1 with the threshold value signal SW in the ascending direction
14 fourth maximum of the envelope 1 above the threshold value signal SW
15 fourth point of intersection of the envelope 1 with the threshold value signal SW in the descending direction
16 fourth point of intersection of the envelope 1 with the threshold value signal SW in the ascending direction
17 fifth maximum of the envelope 1 above the threshold value signal SW
18 fifth point of intersection of the envelope 1 with the threshold value signal SW in the descending direction
19 fifth point of intersection of the envelope 1 with the threshold value signal SW in the ascending direction
20 sixth maximum of the envelope 1 above the threshold value signal SW
21 sixth point of intersection of the envelope 1 with the threshold value signal SW in the descending direction
22 sixth point of intersection of the envelope 1 with the threshold value signal SW in the ascending direction
23 seventh maximum of the envelope 1 above the threshold value signal SW
24 seventh point of intersection of the envelope 1 with the threshold value signal SW in the descending direction
25 envelope during ultrasonic burst
26 transmission of the data of the first point of intersection 4 of the envelope 1 with the threshold value signal SW in the descending direction via the preferably bidirectional data bus
27 transmission of the data of the first point of intersection 5 of the envelope 1 with the threshold value signal SW in the ascending direction via the preferably bidirectional data bus
28 transmission of the data of the first maximum 6 of the envelope 1 above the threshold value signal SW via the preferably bidirectional data bus
29 transmission of the data of the second point of intersection 7 of the envelope 1 with the threshold value signal SW in the descending direction via the preferably bidirectional data bus
30 transmission of the data of the second point of intersection 8 of the envelope 1 with the threshold value signal SW in the ascending direction via the preferably bidirectional data bus
31 transmission of the data of the first maximum 9 of the envelope 1 above the threshold value signal SW and the data of the exemplary first minimum 10 of the envelope 1 above the threshold value signal SW via the preferably bidirectional data bus
32 transmission of the data of the third maximum 1 of the envelope 1 above the threshold value signal SW via the preferably bidirectional data bus
34 transmission of the data of the third point of intersection 12 of the envelope 1 with the threshold value signal SW in the descending direction via the preferably bidirectional data bus
35 transmission of the data of the third point of intersection 13 of the envelope 1 with the threshold value signal SW in the ascending direction via the preferably bidirectional data bus
36 transmission of the data of the fourth maximum 14 of the envelope 1 above the threshold value signal SW via the preferably bidirectional data bus
37 transmission of the data of the fourth point of intersection 15 of the envelope 1 with the threshold value signal SW in the descending direction via the preferably bidirectional data bus
38 transmission of the data of the fourth point of intersection 16 of the envelope 1 with the threshold value signal SW in the ascending direction via the preferably bidirectional data bus
39 transmission of the data of the fifth maximum 17 of the envelope 1 above the threshold value signal SW via the preferably bidirectional data bus
40 transmission of the data of the fifth point of intersection 18 of the envelope 1 with the threshold value signal SW in the descending direction via the preferably bidirectional data bus
41 transmission of the data of the fifth point of intersection 19 of the envelope 1 with the threshold value signal SW in the ascending direction via the preferably bidirectional data bus
42 transmission of the data of the sixth point of intersection 21 of the envelope 1 with the threshold value signal SW in the descending direction via the preferably bidirectional data bus
43 transmission of the data of the received echoes on the LIN bus according to the prior art after the end of reception
44 transmission of data on the LIN bus according to the prior art prior to the emission of the ultrasonic burst
45 transmission of data via the IO interface according to the prior art prior to the emission of the ultrasonic burst
46 effect of the ultrasonic transmission burst on the output signal of the IO interface according to the prior art
47 signal of the first echo 5, 6, 7 on the IO interface according to the prior art
48 signal of the second echo 8, 9, 10, 11, 12 on the IO interface according to the prior art
49 signal of the third and fourth echoes 13, 14, 15, on the IO interface according to the prior art
50 signal of the fifth echo 16, 17, 18 on the IO interface according to the prior art
51 signal of the sixth echo 19, 20, 21 on the IO interface according to the prior art
52 signal of the sixth echo 22, 23, 24 on the IO interface according to the prior art
53 start command from the computer system to the sensor via the data bus
54 periodic automatic data transmission between sensor and computer system, preferably in accordance with DSI3 standard
55 diagnosis bits after measuring cycle
56 end of transmission of ultrasonic burst (end of transmission burst). Preferably the end of the ultrasonic burst coincides with point 4
57 start of the emission of the ultrasonic burst (start of transmission burst)
58 end of data transmission
a transmitted information for the transmission of the received ultrasonic echoes by means of an IO interface of the prior art
A first triangular object
a.u. "arbitrary units"=freely selected units
B transmitted information for the transmission of the received ultrasonic echoes by means of a LIN interface of the prior art
c transmitted information for the transmission of the received ultrasonic echoes by means of the proposed method and the proposed device with envelope for comparison
d transmitted information for the transmission of the received ultrasonic echoes by means of the proposed method and the proposed device without envelope e schematic signal waveforms upon transmission of the received echo information by means of an IO interface of the prior art
En amplitude of the envelope of the received ultrasonic signal
f schematic signal waveforms upon transmission of the received echo information by means of a LIN interface of the prior art
g schematic signal waveforms upon transmission of the received echo information by means of a bidirectional data interface
SB transmission burst
SW threshold
t time
$T_E$ reception time. Reception time typically starts with the end 56 of the emission of the ultrasonic burst. It is possible to start reception already before. However, this may cause problems that possibly require additional measures.

The invention claimed is:

1. A method for transmitting data via a vehicle data bus from an ultrasonic system having at least two sensors, each of the at least two sensors including a respective ultrasonic transmitter and a respective ultrasonic receiver, to a data processing device; and for processing the transmitted data; comprising:
transmitting the data per sensor to the data processing device, including:
extracting predetermined signal profile characteristics from an echo signal received by at least one of the at least two ultrasonic receivers of the ultrasonic system;
identifying a signal profile object in the echo signal based on a group of the extracted predetermined signal profile characteristics,
wherein the signal profile characteristics are one or more of: (1) a local extreme value of the echo signal with a time of occurrence, which value is above a threshold value, (2) an absolute extreme value of the echo signal with a time occurrence, which value is above a threshold value, (3) a saddle point of the echo signal with a time occurrence, which saddle point is above a threshold value, (4) an exceeding of a threshold value with a time of exceeding the threshold, which exceeding occurs as a signal level of the echo signal increases, (5) an undershooting of a threshold with a time of the undershooting, which undershooting occurs as the signal level of the echo signal decreases, and (6) a predeterminable combination of one or a plurality of the signal profile characteristics 1-5 which occur in chronological succession,
and further wherein the signal profile object is a form or sequence of forms of the echo signal including one or more of the signal profile characteristics;
allocating the identified signal profile object to one of a plurality of predetermined signal profile object classes, wherein each of the plurality of predetermined signal profile object classes is specified by an identifier;
determining for the identified signal profile object at least one object parameter describing the identified signal profile object,
wherein the object parameter(s) is (are):
a time of occurrence of the identified signal profile object relative to a reference time;
a temporal extent of the identified signal profile object;
an amount of time between the identified signal profile object and another signal profile object preceding or trailing in the echo signal;
a peak value of the identified signal profile object;
a time of the peak value of the identified signal profile object within the temporal extent thereof and/or
a size of an area of an echo signal section belonging to the identified signal profile object above a threshold value or a threshold signal profile;
wherein at least one of the identified signal profile objects includes a respective peak value; and
the echo signal section belonging to the identified signal profile object can be reconstructed from the identifier of the signal profile object class and the object parameter(s) determined for the identified signal profile object; and
transmitting, by at least one sensor of the at least two sensors, as compressed data for the identified signal profile object, via the vehicle data bus, the identifier and the object parameter(s) as echo signal section data representing the echo signal section of the identified signal profile object for the purpose of detecting an obstacle and/or a distance of an obstacle to the at least one ultrasonic receiver or one of the at least two ultrasonic receivers of the ultrasonic system, to the data processing device; wherein the transmitted identified signal profile objects include the at least one identified signal profile object including the respective peak value and the transmitted object parameters include the respective peak value for the at least one identified signal profile object including the respective peak value; and
processing, by the data processing device, the data, including:
reconstructing the data of the respective ultrasonic receivers of the at least two sensors into respective reconstructed received ultrasonic signals in the data processing device; and
performing a recognition of obstacles in an environment of the at least two sensors based the respective reconstructed received ultrasonic signals.

2. The method of claim 1, wherein the peak value is a maximum peak value of the identified signal profile object.

3. The method of claim 2, wherein the time of the peak value is a time of the maximum peak value of the identified signal profile object.

4. The method of claim 1, wherein the size of the area of the echo signal section belonging to the identified signal profile object is a size of a proportion of the area of the echo signal section belonging to the signal profile object.

5. The method of claim 1, wherein the echo signal section data, which represents a plurality of identified signal profile objects respectively identified from a plurality of echo signals received in a predeterminable time slot, are transmitted from the respective ultrasonic receivers of the at least two sensors to the data processing device via the vehicle data bus for the purpose of detecting the obstacle and/or the distance of the obstacle to the at least one ultrasonic receiver or one of the at least two of the ultrasonic receivers of the ultrasonic system.

6. The method of claim 5, wherein, in addition to the echo signal section data, a respective confidence value allocated to each of the plurality of identified signal profile objects is transmitted from the ultrasonic receivers of the at least two sensors to the data processing device via the vehicle data bus.

7. A system comprising the at least two sensors and the data processing device for executing the method of claim 1.

8. The method of claim 1, wherein the group of predetermined signal profile characteristics includes at least (1) the local extreme value of the echo signal with a time of occurrence, which value is above a threshold value and (2) the absolute extreme value of the echo signal with a time occurrence, which value is above a threshold value.

9. The method of claim 1, wherein the group of predetermined signal profile characteristics includes at least (1) the local extreme value of the echo signal with a time of occurrence, which value is above a threshold value, (2) the absolute extreme value of the echo signal with a time occurrence, which value is above a threshold value, (3) the saddle point of the echo signal with a time occurrence, which saddle point is above a threshold value, (4) the exceeding of a threshold value with a time of exceeding the threshold, which exceeding occurs as a signal level of the echo signal increases, and (5) the undershooting of a threshold with a time of the undershooting, which undershooting occurs as the signal level of the echo signal decreases.

10. The method of claim 1, wherein the group of predetermined signal profile characteristics includes at least (1) the local extreme value of the echo signal with a time of occurrence, which value is above a threshold value, (2) the absolute extreme value of the echo signal with a time occurrence, which value is above a threshold value, (3) the saddle point of the echo signal with a time occurrence, which saddle point is above a threshold value, (4) the exceeding of a threshold value with a time of exceeding the threshold, which exceeding occurs as a signal level of the echo signal increases, (5) the undershooting of a threshold with a time of the undershooting, which undershooting occurs as the signal level of the echo signal decreases, and (6) the predeterminable combination of one or a plurality of the signal profile characteristics 1-5 which occur in chronological succession.

11. The method of claim 1, wherein the transmitted peak value is different from the threshold value.

12. The method of claim 1, wherein the transmitted peak value is an amplitude of the echo signal at the time of the peak.

* * * * *